(12) United States Patent
Lee et al.

(10) Patent No.: US 8,929,136 B2
(45) Date of Patent: Jan. 6, 2015

(54) 8T NVSRAM CELL AND CELL OPERATIONS

(71) Applicant: Aplus Flash Technology, Inc, San Jose, CA (US)

(72) Inventors: Peter Wung Lee, Saratoga, CA (US); Hsing-Ya Tsao, San Jose, CA (US)

(73) Assignee: Aplus Flash Technology, Inc.

( * ) Notice: Subject to any disclaimer, the term of this patent is extended or adjusted under 35 U.S.C. 154(b) by 0 days.

(21) Appl. No.: 14/059,618

(22) Filed: Oct. 22, 2013

(65) Prior Publication Data

US 2014/0119118 A1 May 1, 2014

Related U.S. Application Data

(60) Provisional application No. 61/719,344, filed on Oct. 26, 2012, provisional application No. 61/723,270, filed on Nov. 6, 2012.

(51) Int. Cl.
*G11C 14/00* (2006.01)

(52) U.S. Cl.
CPC ............ *G11C 14/0063* (2013.01); *G11C 14/00* (2013.01)
USPC ............ 365/185.08; 365/185.01; 365/185.07; 365/154; 365/156

(58) Field of Classification Search
CPC ... G11C 14/00; G11C 14/0018; H01L 27/115
USPC ........... 365/185.08, 185.01, 185.07, 154, 156
See application file for complete search history.

(56) References Cited

U.S. PATENT DOCUMENTS

| 4,703,456 | A | 10/1987 | Arakawa |
| 5,065,362 | A | 11/1991 | Herdt et al. |
| 5,563,839 | A | 10/1996 | Herdt et al. |
| 5,602,776 | A | 2/1997 | Herdt et al. |
| 5,828,599 | A | 10/1998 | Herdt |
| 5,903,561 | A | 5/1999 | Kwon |
| 5,914,895 | A * | 6/1999 | Jenne ........................ 365/185.08 |
| 6,026,018 | A | 2/2000 | Herdt et al. |
| 6,097,629 | A | 8/2000 | Dietrich et al. |
| 6,285,586 | B1 | 9/2001 | Lung et al. |
| 6,414,873 | B1 | 7/2002 | Herdt |
| 6,556,487 | B1 * | 4/2003 | Ratnakumar et al. ..... 365/185.08 |
| 6,965,524 | B2 * | 11/2005 | Choi ........................ 365/185.08 |
| 7,110,293 | B2 | 9/2006 | Jung |
| 7,164,608 | B2 | 1/2007 | Lee |
| 7,269,054 | B2 | 9/2007 | Kang et al. |
| 7,280,397 | B2 | 10/2007 | Scheuerlein |
| 7,408,801 | B2 | 8/2008 | Kang et al. |

(Continued)

*Primary Examiner* — Connie Yoha
(74) *Attorney, Agent, or Firm* — Fang Wu

(57) ABSTRACT

One or more embodiments of 8T NVSRAM cell are provided for improving NVSRAM memory architecture with reduced cell size as opposed to the prior art of 12T NVSRAM cell. This novel 8T NVSRAM cell uses one step Write operation under either a FN-channel write scheme to increase a paired flash transistor Vt values in positive direction with a desired $\Delta Vt12 \geq 1V$ or a FN-edge write scheme to decrease the Vt values in negative direction with a similar desired $\Delta Vt12 \geq 1V$ to write the $\Delta Vt12$ into the paired flash transistors within 1-10 ms without requiring a pre-erase step. There is no need of Program-Inhibit Voltage (SBPI) to inhibit non-select flash transistor from programming. In addition, this 8T NVSRAM cell uses DRAM-like charge-sensing scheme to detect the $\Delta V$ on Q and QB nodes of SRAM in which is coupled and generated from the $\Delta Vt12$ stored in MC1 and MC2 flash transistors.

36 Claims, 13 Drawing Sheets

(56) References Cited

U.S. PATENT DOCUMENTS

| | | |
|---|---|---|
| 7,505,303 B2 | 3/2009 | Ashokkumar et al. |
| 7,518,916 B2 | 4/2009 | Ashokkumar et al. |
| 7,539,054 B2 | 5/2009 | Ashokkumar et al. |
| 7,663,917 B2 | 2/2010 | Cuppens et al. |
| 7,710,776 B2 | 5/2010 | Johal et al. |
| 7,760,540 B2 | 7/2010 | Still |
| 7,859,899 B1 | 12/2010 | Shakeri et al. |
| 7,890,804 B2 | 2/2011 | Mann et al. |
| 8,018,768 B2 | 9/2011 | Shih et al. |
| 8,036,032 B2 | 10/2011 | Scade et al. |
| 8,331,134 B2 | 12/2012 | Chiu et al. |
| 2014/0119120 A1* | 5/2014 | Lee .................... 365/185.08 |

* cited by examiner

8T NVSRAM CELL AND CELL OPERATIONS

CROSS-REFERENCE TO RELATED APPLICATIONS

This application claims priority to U.S. Patent Application No. 61/719,344, filed on Oct. 26, 2012, and also claims priority to U.S. Patent Application No. 61/723,270, filed on Nov. 6, 2012, commonly assigned, and hereby incorporated by references in their entireties herein for all purposes.

This application is related to U.S. Pat. No. 7,164,608 and U.S. patent application Ser. Nos. 14/037,356 and 14/058,227, commonly assigned, and hereby incorporated by references herein for all purposes.

Additionally, this application is related to U.S. Pat. No. 7,760,540.

TECHNICAL FIELD OF THE INVENTION

The present invention relates to a preferred 8T NVSRAM cell comprising of one LV 6T CMOS SRAM cell and one HV 2T Flash cell. Each 8T NVSRAM cell of the present invention comprises only one pair of 1T flash transistors with their respective source nodes left floating and their respective drain nodes connected to the paired Q and QB of each SRAM cell. Each 1T flash transistor of this 8T NVSRAM cell can be made of either a PMOS or a NMOS cell type, regardless of a 2-poly floating-gate type, or a 1-poly charge-trapping SONOS or MONOS type.

In addition, the present invention provides a method of Write operation to alter threshold levels Vts stored in Flash cells using an one-step Write operation without an erase step that is always aimed to Write the $\Delta Vt$ difference on the selected paired flash transistors, utilizing two preferred schemes including a low-current FN-channel Write scheme and FN-edge Write scheme. Alternatively, several options of performing NVSRAM Program and Erase operations under a FN-channel scheme and a FN-edge scheme are provided for above 8T NVSRAM cell.

BACKGROUND OF INVENTION

The ultimate goal for a NVSRAM memory design is to work like a regular SRAM memory but with a non-volatil-ability to store the data after power is removed. This is called the Store operation. There are three kinds of Store operations and each time is performed to write SRAM cell's data into each corresponding Flash cell.

In a traditional 12T NVSRAM cell, the Write operation is a 2-step operation that uses Erase as a first step to either increase or decrease Flash cell Vt and is followed Program as a second step to conversely decrease and increase Flash cell's Vt to get the final desired Vts of Vt1 ($\geq 2V$) and Vt0 ($\leq -2V$) on a single Flash cell. As a result, for traditional 12T NVSRAM cells a Recall operation is based on a method to detect a wide $\Delta Vt$ (Vt1-Vt0=4V) between one paired flash transistors. But after a long P/E endurance cycle, the distance of the gap of $\Delta Vt$ of Erase and Program Vt becomes smaller, thus the 12T NVSRAM cell operation becomes critical.

Therefore, an improved NVSRAM cell design with reduced cell size and proper write operation and recall operation are desired and become objectives of the present invention.

SUMMARY OF THE INVENTION

The present invention relates to a preferred Eight-transistor (8T) NVSRAM cell comprising of one LV 6T CMOS SRAM cell and one HV 2T Flash cell. Each 8T NVSRAM cell of the present invention comprises only one pair of 1T flash transistors with their respective source nodes left floating and their respective drain nodes connected to the paired Q and QB of each SRAM cell. This preferred 8T NVSRAM cell is by far made of the least numbers of transistors as compared to many prior art that either require 12T or 10T. The flash transistor can be made of PMOS or NMOS cell structures, or 1-poly charging-trapping of 2-poly floating-gate cell structures.

In an embodiment, the present invention provides an 8T NVSRAM cell that is configured to use a low-current FN-channel Write scheme to increase both flash transistor Vts in positive direction with a desired $\Delta Vt \geq 1V$ only by applying the same flash gate voltage VPP with two different flash transistor channel voltages, VSS and VDD, which are supplied directly by paired Q and QB nodes from each corresponding 6T SRAM cell. The VDD can be as low as 1.2V.

In another embodiment, the present invention provides an 8T NVSRAM cell that is configured to use another low-current FN-edge Write scheme to decrease both flash transistor Vts in a negative direction with a desired $\Delta Vt \geq 1V$ only by applying the same flash gate voltage VNN with two different flash's channel voltages, VSS and VDD, that are supplied directly by the paired Q and QB nodes from each corresponding 6T SRAM cell. The VDD can be as low as 1.2V.

In yet another embodiment, the present invention provides an 8T NVSRAM cell associated with a preferred Recall operation that is preferably using the DRAM-like charge-sensing scheme that is able to detect at least $\Delta Vt > 1V$ between Q and QB nodes by coupling $\Delta Q$ from the paired flash transistors that store $\Delta Vt > 0$. Before coupling, both initial Q and QB voltages of SRAM cell have to be preset to VSS.

In still another embodiment, the present invention provides an 8T NVSRAM cell configured to perform a conventional NVSRAM Store operation with a desired $\Delta Vt$ for paired flash transistors by using one Write operation that uses either FN-channel scheme or FN-edge scheme without a pre-erase operation.

In yet still another embodiment, the present invention provides a method for operating the 8T NVSRAM cell Store operation by alternatively using a FN-channel scheme and a FN-edge scheme to increase and decrease Flash transistor center Vt value and $\Delta Vt$ so that the paired flash transistor Vt distribution can be kept within +5V and -1V, not beyond. A Recall operation with SRAM amplifications have to be divided into six steps shown in the specification.

In a specific embodiment, the present invention discloses an 8T NVSRAM cell that comprises one LV 6T SRAM cell and one paired 2T NMOS Flash cell without the top paired Select transistor and their source nodes connected to a common Flash power line. The Flash type can be made of either a 2-poly floating-gate type or a 1-poly charge-trapping SONOS and MONOS types, PMOS type or NMOS type. The 1-poly Select NMOS transistor can be made from 1-poly Flash SONOS or MONOS transistor but without a Nitride layer.

In another specific embodiment, the present invention provides an 8T NVSRAM memory cell circuit with DRAM-like charge-sensing scheme. The 8T NVSRAM memory cell includes a SRAM cell comprising two inverters cross-coupled to a first pass transistor and a second pass transistor commonly gated by a first word line and respectively coupled drains to a first bit line and a second bit line and sources to a first data node and a second data node. The first data node and the second data node respectively are outputted from the two invertors. Each inverter including a PMOS device connected to a first power line and a NMOS device connected to a second power line. The first power line and the second power line are operated between a VDD power supply and ground and being separated from a common Nwell node. Additionally, the 8T NVSRAM memory cell circuit includes a Flash cell comprising a first cell string and a second cell string sharing a common P-sub. The first cell string includes a first Flash transistor having a first drain node and first source node. The second cell string includes a second Flash transistor having a second drain node and a second source node. The first and the second Flash transistors are gated commonly by a second word line. The first drain node is connected to the first data node and the second drain node is connected to the second data node. The first source node and the second source node are floating. The second word line is configured to ramp up to a voltage level sufficient to detect as small as 1V threshold level difference between the first Flash transistor and the second Flash transistor and pass a voltage level difference to the first data node and the second data node. The two cross-coupled inverters are operated to amplify the voltage level difference to a scale of VSS=0V at one of the first data node and the second data node and the VDD level at another one of the first data node and the second data node.

In an alternative embodiment, the present invention provides an 8T NVSRAM memory cell circuit with a current-charging scheme. The 8T NVSRAM memory cell includes a SRAM cell comprising two inverters cross-coupled to a first pass transistor and a second pass transistor commonly gated by a first word line and respectively coupled drains to a first bit line and a second bit line and sources to a first data node and a second data node. The first data node and the second data node respectively are outputted from the two invertors. Each inverter includes a PMOS device connected to a first power line and a NMOS device connected to a second power line. The first power line and the second power are operated between a VDD power supply and a ground level VSS=0V. The 8T NVSRAM memory cell additionally includes a Flash cell comprising a first Flash transistor and a second Flash transistor sharing a common P-sub. The first Flash transistor has a first drain node and a first source node. the second Flash transistor has a second drain node and a second source node. The first drain node is coupled to the first data node and the second drain node is coupled to the second data node. The first and the second Flash transistors are gated commonly by a second word line. The first source node and the second source node are commonly coupled to a third power line. The third power line is configured to ramp up to the VDD level to cause two different currents flown through the first Flash transistor and the second Flash transistor associated with a threshold level difference greater than 1V to generate two different charge levels at the first data node and the second data node in a Recall operation. The two cross-coupled inverters are configured to amplify the two different charge levels to one at the VDD level and another one at VSS=0V by sequentially ramping the first power line from a preset VSS=0V to the VDD level followed by ramping the second power line from a preset the VDD level to VSS=0V.

In an embodiment, the 8T NVSRAM cell uses one-step Write operation that is always aimed to Write the ΔVt difference on the selected paired flash transistors. Thus, the absolute values of the Write Vts are not critical and important for a normal 8T NVSRAM cell operation. As a result, the convergence of Erase Vt and program Vt at is relatively no longer a concern as compared to the conventional NVSRAM cell, thus the P/E cycles can be extended beyond 1M cycles easily.

Furthermore, the Write operation of this 8T NVSRAM cell has two preferred scheme and these two schemes are preferably alternately performed in each Write to avoid the Flash transistor Vt only moves one direction. These two schemes include the low-current FN-channel Write and FN-edge Write operations. The FN-channel scheme is used to increase the Vts of both paired flash transistors with a desired ΔVt1. Conversely, the FN-edge Write is to decrease the Vts of both paired flash transistors with another ΔVt2. From the experimental results, the ΔVt2>ΔVt1 is seen because the FN-edge has accomplished the higher tunneling electric field than FN channel approach. But nevertheless, the ΔVt can be always kept constant across all long Write cycle time (1-10 ms) but with the center Vt value shifted. One important feature of this Write ΔVt can be pre-determined before Write operation is executed. This ΔVt is heavily determined by the SRAM's ΔV on Q and QB nodes. This ΔV=VDD−VSS=VDD because VSS=0V.

From simulation, the present 8T NVSRA cell can detect as low as ΔVt=0.5V by using the DRAM-like Charge-sensing scheme. As a summary, this preferred 8T NVSRAM cell as by-far the least numbers of transistors in NVSRAM memory can easily work down to about 1V VDD operation like a regular 1V SRAM memory and then to store each NV SRAM cell's data into each NVM Flash cell upon the power-down period. The flash transistor can be made of PMOS or NMOS cell structures, or 1-poly charge-trapping type or 2-poly floating-gate type cell structures.

DETAILED DESCRIPTION OF THE INVENTION

The present invention relates to a preferred 8T NVSRAM cell comprising of one LV 6T CMOS SRAM cell and one HV 2T Flash cell. Each 8T NVSRAM cell of the present invention comprises only one pair of 1T flash transistors with their respective source nodes left floating and their respective drain nodes connected to the paired Q and QB of each SRAM cell. Each 1T flash transistor of this 8T NVSRAM cell can be made of either a PMOS or a NMOS cell type, regardless of a 2-poly floating-gate type, or a 1-poly charge-trapping SONOS or MONOS type.

As described above, the 8T NVSRAM cell is substantially configured based on a conventional 12T NVSRAM cell by removing a top paired HV Select transistors and a bottom paired HV Select transistors. In particular, it will be illustrated that the top paired Select transistors of the conventional 12T NVSRAM cell are actually not needed. For example, because each SRAM's paired Q and QB nodes will couple the paired logic of VDD/VSS or VSS/VDD to one paired FString's drain nodes, the FString that sees VDD on its drain node will have a stronger electric field for an erase operation than the Fstring's drain node coupled with 0V. Thus, without top Select transistors, both the paired flash cells would be erased without a problem.

Figure 1A:
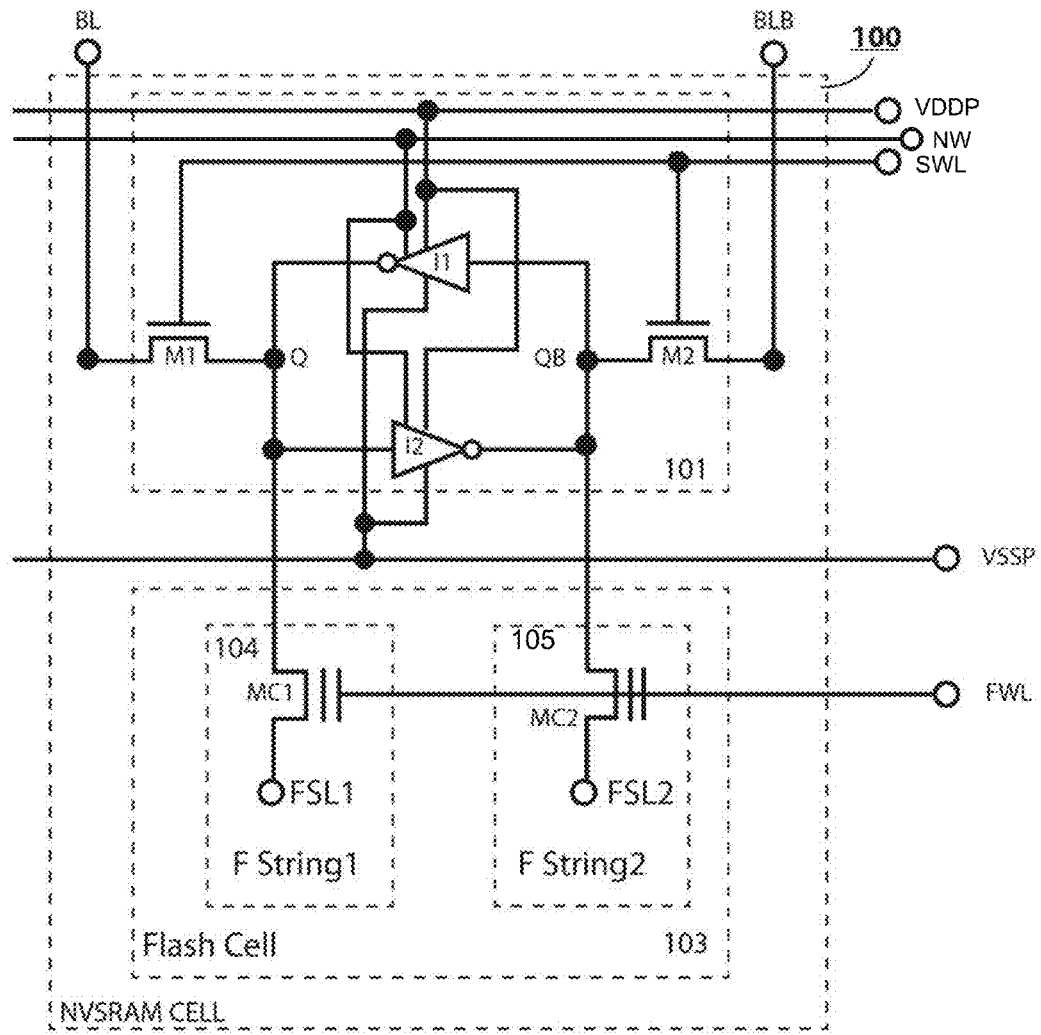
FIG. 1A is a circuit diagram of an 8T 2-poly NMOS NVSRAM cell according to an embodiment of the present invention.

FIG. 1A shows a circuit of a 2-poly NMOS 8T NVSRAM cell according to an embodiment of the present invention. This diagram is merely an example, which should not unduly limit the scope of the claims. One of ordinary skill in the art would recognize many variations, alternatives, and modifications. As shown, the 8T NVSRAM cell 100 includes one 6T LV SRAM cell 101 and one 2T NMOS 2-poly Flash cell 103. Each 2T NMOS 2-poly Flash cell 103 further includes two fully symmetrical 1T NMOS 2-poly Flash strings 104 and 105.

The 6T LV SRAM cell 101 includes two Inverters I1 and I2 cross-connected to two source nodes of two LV NMOS devices M1 and M2. The two source nodes are also data nodes Q and QB respectively outputted from I1 and I2 which are powered through two common power line, VDDP and VSSP. The VDDP line connects to PMOS devices in the two Inverters I1 and I2. VSSP line connects to NMOS devices in the two Inverters. Typically, VDDP line is coupled to a VDD power supply and VSSP line is grounded to VSS=0V. Or they can be reversely connected to VSS and VDD for certain SRAM operation. Both power lines are separated from a common Nwell region of the SRAM cell 101, which is connected to a NW node isolated electrically from the VDDP line and VSSP line.

Unlike all conventional 12T NMOS NVSRAM cells, in the preferred 8T NVSRAM cell for each 1T NMOS 2-poly Flash string 104 or 105 there is only one NMOS 2-poly Flash transistor (1T), MC1 or MC2, with its source node, FSL1 or FSL2, left floating without a top NMOS HV Select transistor and a bottom NMOS HV Select transistor. Each paired drain nodes of the paired NMOS 2-poly Flash strings 103 are preferably connected to each paired nodes of Q and QB of the 6T CMOS LV SRAM cell 101. Thus, the parasitic capacitance on both Q and QB nodes and connections to corresponding paired Flash transistor drain nodes are tracking to set up a good foundation for this 8T SRAM in DRAM-like charge sensing environment.

Additionally, in order to prevent the charge leakage in the SRAM cell 201 when the Recall operation is carried out, the two inverters I1 and I2 are configured to have the VDDP line coupled to VSS separated from a common N-well region connected to and a NW node. At the same time, the two Inverters I1 and I2 have the VSSP line coupled to VDD, providing a bias control to ensure proper shielding of the charges coupled from the Flash strings 104 and 105. More details about how to operating this 8T NVSRAM cell will be illustrated throughout the specification and particularly below.

Figure 1B:
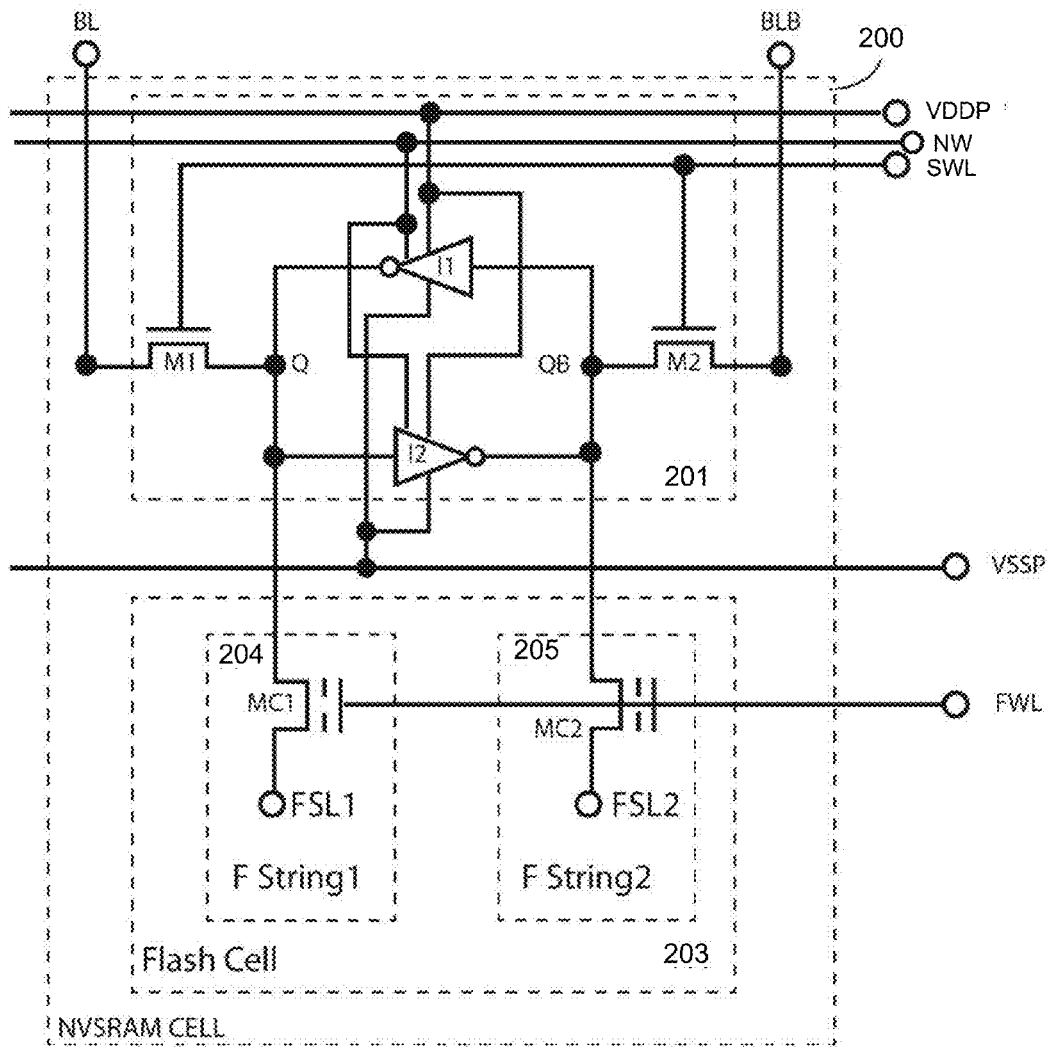
FIG. 1B is circuit diagram of an 8T 1-poly NMOS NVSRAM cell according to another embodiment of the present invention.

In an alternative embodiment, FIG. 1B shows a 1-poly NMOS 8T NVSRAM cell in accordance with the present invention. The 1-poly 8T NVSRAM cell 200 comprises one 6T LV SRAM cell 201 and one 2T NMOS 1-poly Flash cell 203. Each 2T NMOS 1-poly Flash cell 203 further includes two fully symmetrical 1T NMOS 1-poly Flash strings 204. Each preferred 1T NMOS 1-poly Flash string 204 or 205 comprises only one NMOS 2-poly Flash transistor (1T), MC1 or MC2, with its source node left floating without the top NMOS HV Select transistor and the bottom NMOS HV Select transistor. Each paired NMOS 1-poly Flash transistor drain nodes are preferably connected to each paired nodes of Q and QB of the 6T CMOS LV SRAM cell 201. Similarly, the SRAM cell 201 is substantially the same as the SRAM cell 101, wherein two inverters I1 and I2 have their common power line connected to the VDDP line, common Nwell region connected to a NW node separated from the VDDP line, and common source line connected to the VSSP line. The VDDP line and VSSP line are operated between a VDD power supply and ground VSS=0V.

Figure 1C:
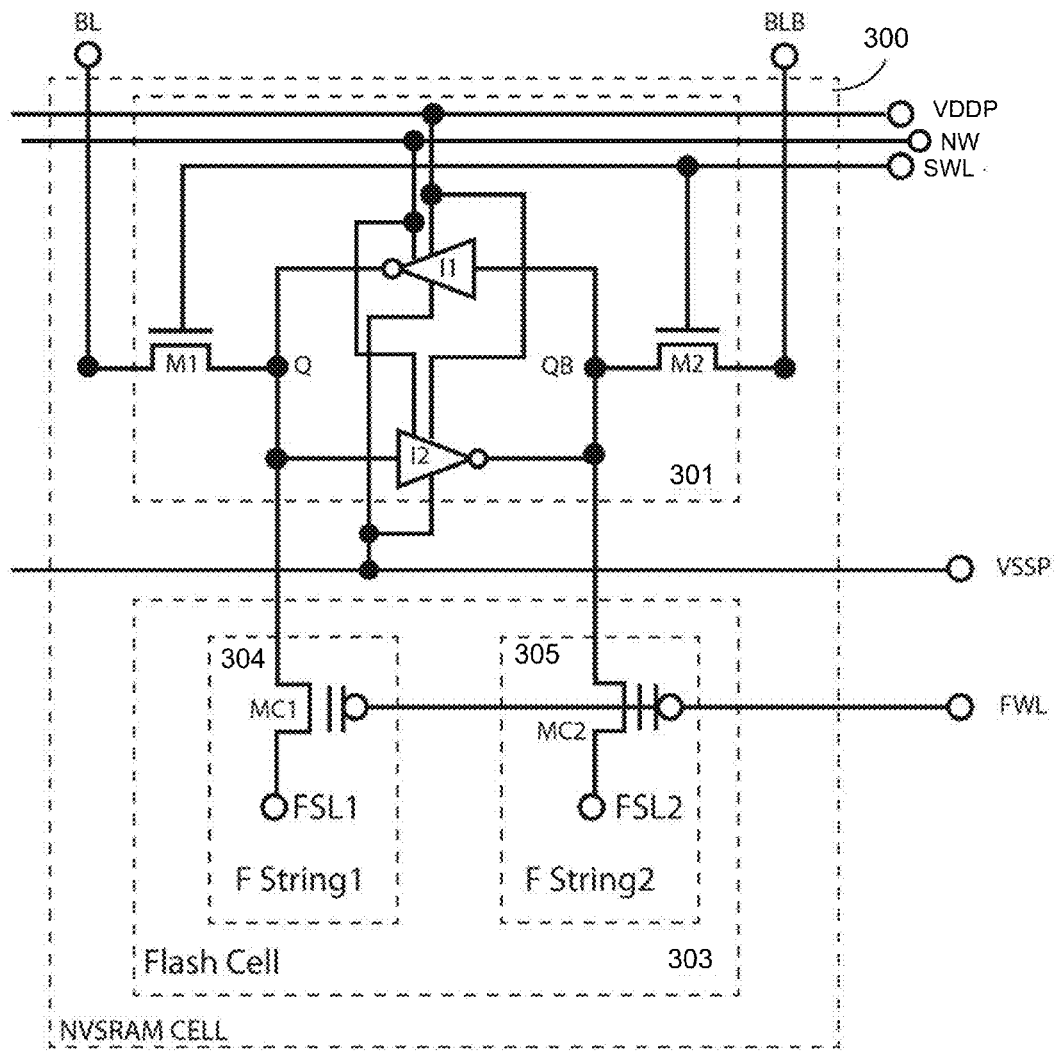
FIG. 1C is circuit diagram of an 8T 2-poly PMOS NVSRAM cell according to yet another embodiment of the present invention.

In another alternative embodiment, FIG. 1C shows a 2-poly PMOS 8T NVSRAM cell in accordance with the present invention. The 2-poly PMOS 8T NVSRAM cell 300 comprises one 6T LV SRAM cell 301 and one 2T PMOS 2-poly Flash cell 303. Each 2T PMOS 2-poly Flash cell 303 includes two fully symmetrical 1T PMOS 2-poly Flash strings 304. Each preferred 1T PMOS 2-poly Flash string 304 or 305 includes only one PMOS 2-poly Flash transistor (1T), MC1, or MC2, with its source node left floating without the top PMOS HV Select transistor and the bottom PMOS HV Select transistor. Each paired 2-poly PMOS flash transistor drain nodes are preferably connected to each paired nodes of Q and QB of each 6T CMOS LV SRAM cell 301. Similarly, the SRAM cell 301 is substantially the same as the SRAM cell 101, wherein two inverters I1 and I2 have their common power line connected to the VDDP line, common Nwell region connected to a NW node separated from the VDDP line, and common source line connected to the VSSP line. The VDDP line and VSSP line are operated between a VDD power supply and ground VSS=0V.

No matter what the Flash transistor, either a 2-poly floating-gate type, or a 1-poly charge-trapping SONOS or MONOS type, is used in above 8T NVSRAM cell, all key operations of these 8T NVSRAM cells are substantially the same except minor adjustment on specific bias voltage level for erase or program operations. Now, using a series of simulations based on a circuit using the embodiment of 8T NMOS NVSRAM cell shown in FIG. 1A, all key operations are described below.

SRAM operation: For an NVSRAM cell array made by a plurality of 8T NVSRAM cells of proposed of the present invention, the SRAM word line SWL is set to the VDD power supply level for the select SRAM cells associated with the same SRAM SWL, but for the non-select SRAM cell in same page or row the SWL=VSS. The SRAM cell is operated at the VDD coupled to VDDP and VSS=0V for grounding the VSSP. For the Flash cell bias conditions during the SRAM operation, the flash gate control signal FWL is set to VSS to shut off two flash transistors MC1 and MC2 to isolate each SRAM cell from each Flash cell if channel threshold levels Vts of both MC1 and MC2 are all positive. Alternatively, the flash gate control signal FWL is set to −3V if one of Vts of MC1 and MC2 is negative but higher than −3V, then FWL is preferably biased at −3V to shut off both MC1 and MC2 so that the Flash cell can be isolated from each SRAM cell. Note, this isolation is achieved without need of using any top or bottom Select transistors.

Flash operation: Set SRAM word line SWL to VSS to disable SRAM cell. A FN-channel Write scheme is used in this Flash operation. With the scheme, a definition of the flash cell Vt state includes setting a first flash transistor MC1 Vt to Vt1 and a second flash transistor MC2 Vt to Vt2. The Vt change of MC1 during any Flash operation is denoted as $\Delta Vt1$. Similar to MC2, $\Delta Vt2$ as MC2 Vt change during the same Flash operation. And $\Delta Vt12$ is Vt difference between MC1 and MC2.

Since there is no isolation between SRAM's Q and QB nodes to the drain nodes of both MC1 and MC2 in this 8T NVSRAM cell, thus this FN-channel Write operation can be easily initiated by just coupling a positive high voltage VPP to FWL when the SRAM's Q and QB voltage is present. As a result, both the Vt1 of MC1 and Vt2 of MC2 flash transistors will be increased with different rate to provide a $\Delta Vt12$ varying with time at least after 1 ms of the writing operation. The $\Delta Vt12$ value is substantially independent of time after 1 ms and is determined only by one factor of the VDD value.

Figure 2:
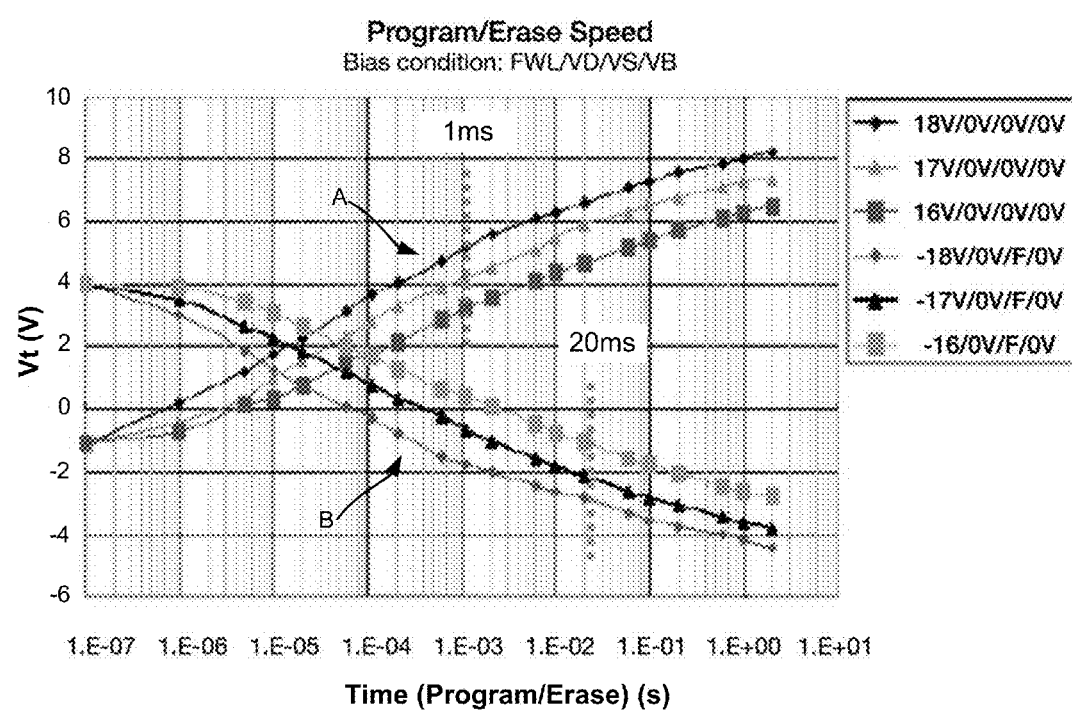
FIG. 2 is chart showing a Flash transistor's Vt distribution versus time of a 12T NVSRAM's FN-channel program and FN-channel erase operations.

FIG. 2 shows simulation results of a Flash transistor Vt distribution versus time of an 8T NVSRAM's FN-channel program and FN-channel erase operations. The FN-channel program graph (curves A) will be used for the preferred Write operation of this 8T NVSRAM cell to increase both Vt1 and Vt2 of MC1 and MC2 flash cells with a desired $\Delta Vt \geq 1V$.

As shown in FIG. 2, under VPP=18V and VDD=1V, the selected flash cell with VSS channel would get full VPP voltage of VPP−VSS=18V. But the selected flash cell with VDD channel would get effective VPP−VDD=17V voltage. With the same initial Vt1=Vt2=−1V, the final value of MC1 and MC2 and $\Delta Vt12$ and center value of Vt are shown in the following Table 1 as derived from FN-channel program curves A in FIG. 2 showing a chart of the flash Vts distribution vs. time and VPP and VDD values.

mand controlled initiated by the off-chip MCU. Usually, it involves a sequence of defined steps; 3) Hardware-Store operation: This operation is performed upon the call of Hardware-Store command controlled by one pin and initiated by the off-chip MCU. Usually, it also involves a sequence of defined steps.

After each Store operation using the FN-channel scheme is performed, the Vt values and center value of two Vts of both MC1 and MC2 would increase and will never decrease. In an embodiment, this 8T NVSRAM cell (FIG. 1A) is configured to perform the next Write operation under the FN-edge scheme alternated to the previous Write operation done under FN-channel scheme so that the Vts of MC1 and MC2 and the center value of two Vts can be reduced to reverse the Vt movement direction.

Figure 3:
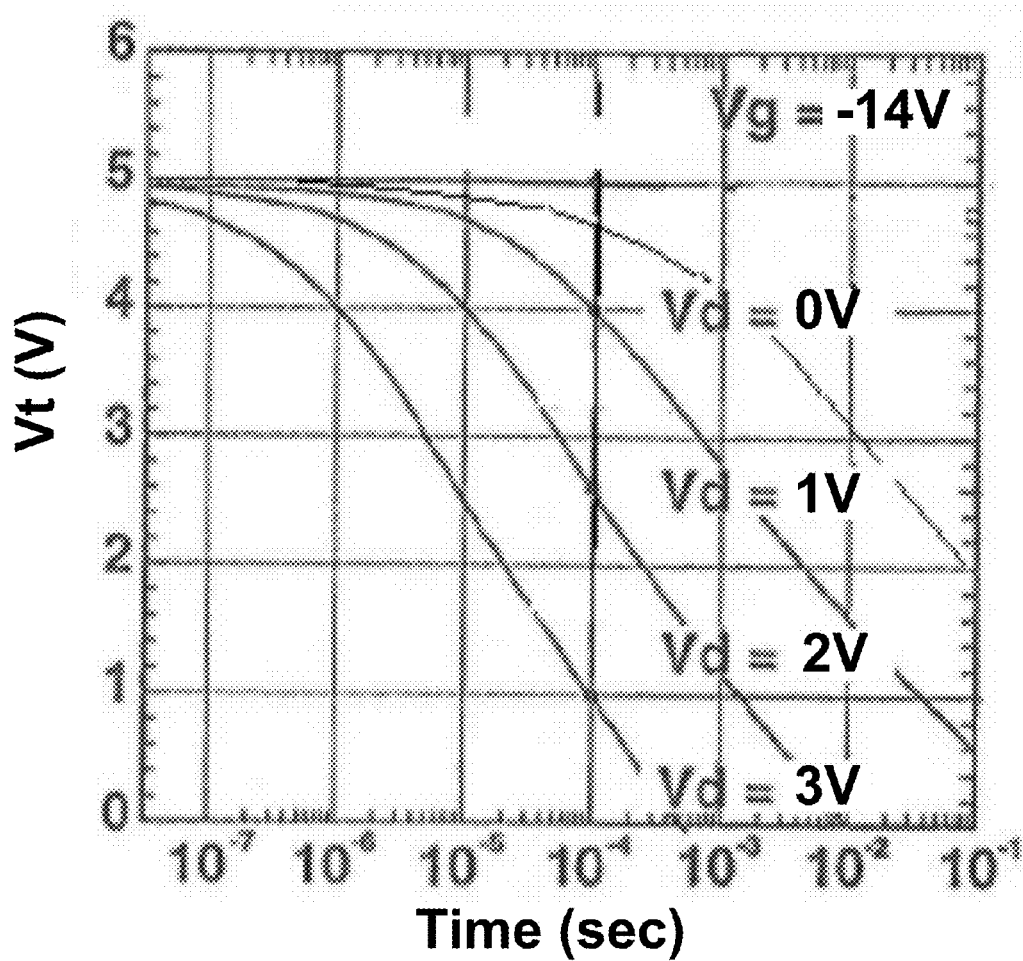
FIG. 3 is a chart showing another Flash transistor's Vt distribution versus time of the 8T NVSRAM's FN-edge Write operation.

Alternatively, FIG. 3 shows another Flash transistor Vt distribution versus time of the 8T NVSRAM cell for using a FN-edge Write operation to decrease both Vt1 and Vt2 of MC1 and MC2 flash cells with a desired $\Delta Vt \geq 1V$. Now, the FN-edge Write operation is explained below with respect to the graph of FIG. 3 and the erase graph B shown in FIG. 2.

Assuming the initial voltages, Q=VSS and QB=VDD, then the drain node voltage of MC1 is VSS but the drain node voltage of MC2 is VDD. Thus MC2 drain node voltage is higher than MC1 drain node voltage level. So, MC2 is associated with a stronger electric field at MC2 drain edge than the MC1 at corresponding drain edge. As a result, the MC2 Vt is decreased in a faster manner than the decline of MC1 Vt. If the initial Vt of MC1 and MC2 is same 5V (see FIG. 3), but after a pre-determined Erase time, the MC1 and MC2 would end up with a $\Delta Vt12$, depending on the Write time, VDD and VNN values. If VDD is 1V operation with FWL=−16V, by referring to the FIG. 2 and FIG. 3, after about 1 ms, both cells Vt will have about 3V difference between MC1 and MC2.

For example, both cells, MC1 and MC2, start from the same initial level Vt=5V, then the drain node voltage of MC1 becomes 0V (corresponding to Q=VSS) and the drain node voltage of MC2 is VDD (corresponding to QB). At 1 ms, MC1 Vt drops to 4.2V from 5V but MC2 drops to 1.2V from 5V. Thus, $\Delta Vt12$ ends with 3V. When FN-edge erase time increases to 10 ms, MC1 Vt further drops to 3.2V but MC2 Vt further drops to 0.2V. Thus, $\Delta Vt12$ still ends with a 3V. The $\Delta Vt12$ is roughly kept a constant independent of the write time after 1 ms. But if at 100 μs, the MC1 Vt1=4.6V but MC1

TABLE 1

| FN-channel Write | MC1 Vt1 Q = VDD | MC2 Vt2 QB = VSS | MC1 Vt1 Q = VSS | MC1 Vt2 QB = VDD | $\Delta Vt12$ 1 ms | Vt center value | $\Delta Vt12$ 10 ms | Vt center value |
|---|---|---|---|---|---|---|---|---|
| VDD = 1 V VPP = 18 V | Increase less | Increase more | Increase more | Increase less | ~1 V | ~4.7 V | ~1 V | ~5.7 V |
| VDD = 2 V VPP = 18 V | Increase less | Increase more | Increase more | Increase less | ~2 V | ~4.2 V | ~2 V | ~5.2 V |
| VDD = 1 V VPP = 17 V | Increase less | Increase more | Increase more | Increase less | ~1 V | ~3.7 V | ~1 V | ~4.7 V |
| VDD = 2 V VPP = 17 V | Increase less | Increase more | Increase more | Increase less | ~2 V | ~3.2 V | ~2 V | ~4.2 V |

The above Flash write operation is preferably done once per 1 ms per Store operation of the 8T NVSRAM memory. In common NVSRAM specifications, there are three kinds of Store operations: 1) Auto-Store operation: This operation is performed upon the typical VDD power loss. Every SRAM cell logic data has to be written into its corresponding NVM Flash cell automatically; 2) Software-Store operation: This operation is performed upon the call of Software-Store com- Vt2=2.6V. The $\Delta Vt12$ is only 2V, still smaller than 3V. In other words, after 1 ms the $\Delta Vt12$ is more approaching a constant value of 3V.

The above explanation is based on the same initial values of Vt1=Vt2=5V as seen in FIG. 3. In an alternative embodiment, Table 2 provides final Vt1 and Vt2 values based on the FN-edge Write scheme under a condition of two initial Vts being set as Vt1=3.7V and Vt2=4.2V after 1 ms FN-channel Write.

The way to come up the final Vt value is based on the graph, the VDD=1V at flash drain-edge in FIG. 3 is like the VDD=1.5V in flash channel between drain and source nodes.

TABLE 2

| FN-edge Write | MC1 Vt1 initial Q = VSS | MC2 Vt2 initial QB = VDD | MC1 Vt1 Final 1 ms | MC2 Vt2 Final 1 ms | ΔVt12 1 ms |
|---|---|---|---|---|---|
| VDD = 1 V VNN = −17 V | 3.7 V decrease more | 4.2 V decrease less | −1 V | 0.4 V | 1.4 V |

As a conclusion, ΔVt12≈1.5V for a FN-edge Write operation at VDD=1V after 1 ms. For VDD=2V, then than ΔVt12≈3V, but both Vt1 and Vt2 values would be all negative, which is not preferable.

As shown in FIG. 3, simulation based on the 8T NVSRAM cell for Store operation shows that the minimum ΔVt12=1V is more reliable in covering all mismatches in parasitic capacitances in Q and QB nodes. Therefore, it is preferred to operate both Vt1 and Vt2 in positive value or at least one is negative value because FWL is preferred to ramp from VSS to VPP2, which is set around 5V if the maximum Vt1 is 5V but Vt2=4V. In this manner, when FWL is ramped to 5V will turn on the MC2 gate first but MC2 would not be turned on. Thus the induced charges would be more from MC2 than MC1. Typically, after FWL ramps up to 5V, the voltage difference $\Delta V_{Q\text{-}QB}$ at Q and QB nodes would be around 0.1V in many cases when SRAM Q and QB nodes are set at VSS initially. But the center value of Q and QB most of time would be over the Vt of NMOS devices in two Inverters I1 and I2 of the SRAM cell after FWL is ramped to 5V.

As a result, both voltages of Q and QB will be discharged to below 0.5V with a voltage difference $\Delta V_{Q\text{-}QB}$=0 because now Q=QB. As a result, the FWL coupling effect to detect ΔVt12 of MC1 and MC2 on Q and QB nodes is cancelled.

Therefore, the 8T NVSRAM cell of the present invention is to couple the VSSP line of the SRAM cell to VDD before the FWL voltage is ramped to VDD. In this manner, the mismatch of both NMOS devices of the SRAM cell can be also neglected.

After the FWL is ramped to 5V to successfully couple the generated charges to Q and QB nodes from the paired flash transistors MC1 and MC2 respectively having two different Vt levels, then the VDDP line of the SRAM cell is ramped to VDD to amplify the voltage difference $\Delta V_{Q\text{-}QB}$ of Q and QB first and then the VSSP line is followed by a ramp-down step to further amplify the detected small $\Delta V_{Q\text{-}QB}$ of Q and QB nodes due to the Vt difference of MC1 and MC2 ΔVt12. As a result, the small detected $\Delta V_{Q\text{-}QB}$ of Q and QB would be amplified to the VDD level versus VSS level.

In summary, the present invention uses one-step of a long write time to generate a reversed ΔVt12=1V, there is no need of pre-erase operation as required by prior art 12T NVSRAM cell. In other words, the whole 8T NVSRAM cell's Store operation can be done by either one of two options of the preferred Write operation with the FN-channel to increase the center value and the FN-edge to decrease the center value with a controllable ΔVt12.

Similarly, the FN-channel and FN-edge Write schemes can be used for both 1-poly NMOS 8T NVSRAM cell and 2-poly PMOS 8T NVSRAM cells. The VPP and VNN voltages for 2-poly NMOS flash cell and 2-poly PMOS flash cell are pretty much the same in values. But in contrast, the 1-poly NMOS Charge-trapping SONOS or MONOS flash cell use about +10V VPP and −10V VNN for this preferred Write operation. Therefore, the detailed descriptions for Store and Write are skipped here for brevity without undue the scope of the claims.

Now, the Recall operation of this 8T NVSRAM cell is explained below. As opposite to the conventional 12T NVSRAM cell using the SRAM-like current charging scheme to charged up with a different voltages on nodes Q and QB due to the ΔVt12 stored in paired flash transistors when VSSP line is connected to VDD with an initial Q=QB=VSS.

Figure 4:
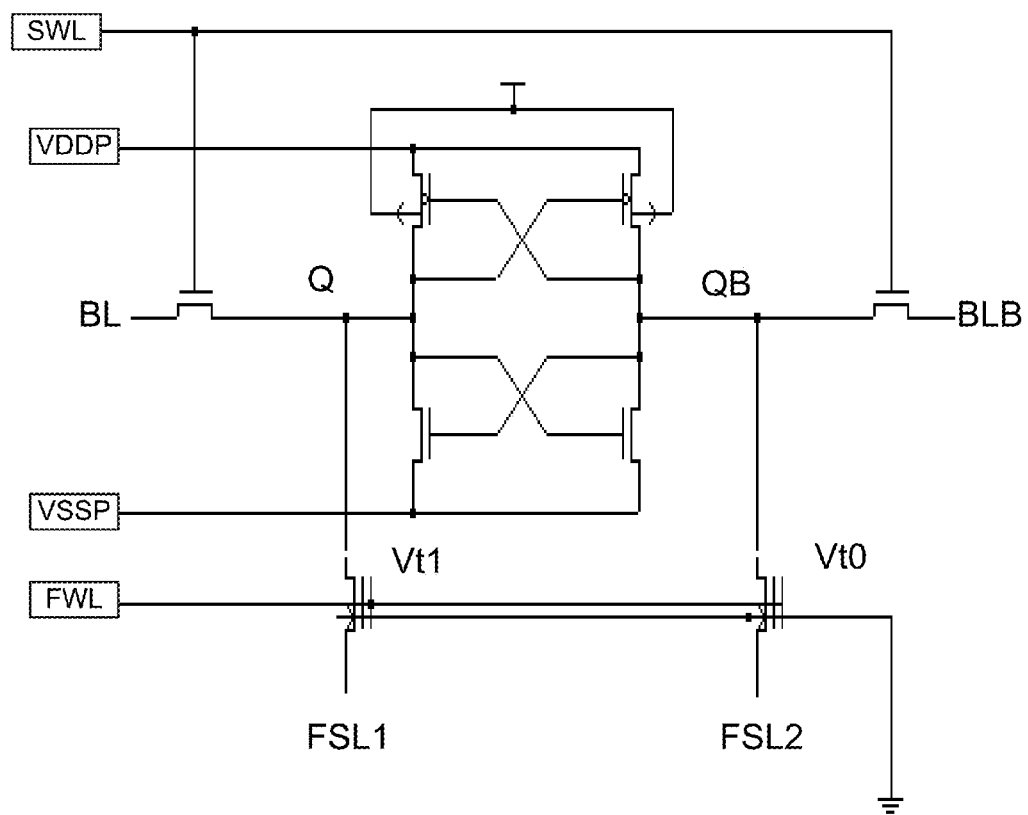
FIG. 4 is a circuit diagram of an 8T NVSRAM cell for simulations to exam Recall operations according to an alternative embodiment of the present invention.

FIG. 4 shows a circuit based on an 8T NVSRAM cell from FIG. 1A for performing the simulation. The power line of all PMOS devices in two inverters, I1 and I2, of the 6T LV CMOS SRAM cell is connected to a VDDP line, which runs horizontally in X-direction in each row of the NVSRAM memory array. Another power line of all NMOS devices in I1 and I2 is connected to VSSP. The Recall simulation is performed to couple the ΔVt of the paired MC1 and MC2 flash transistors to the paired Q and QB nodes of each SRAM when FWL is preferably ramped to a positive voltage higher than both the Vt1 of MC1 and the Vt2 of MC2.

The FWL voltage is preferably set to be around 4V to allow reading the paired flash transistor Vt difference ΔVt as low as 1V but the center Vt value can be ranged from −3V to +3V to cover the wide distribution in a real practical world. This 4V FWL can be generated from an on-chip positive charge pump circuits by using the 1.2V VDD to allow 1.2V SRAM Read and Write operations.

If one of the Vt1 or Vt2 is a negative value with the other is a positive value of MC1 and MC2 flash transistors, then the FWL voltage can be ramped as low as VDD such as 1.2V for a accurate Recall operation.

The 8T NVSRAM uses a DRAM-like charge-sensing scheme to make ΔV>0 at Q and QB with a preset value of VSS. Assuming the charged level Q=V1>QB=V2 due to Q connected to MC1 with lower Vt1 than MC2 Vt2, the Recall operation is divided into 6 steps as shown below in Table 3.

TABLE 3

| Recall | First step | Second step | Third step | Fourth step | Fifth step | Sixth step |
|---|---|---|---|---|---|---|
| Q | VSS | VSS | V1 | VDD/V3 | VDD/VSS | VDD/VSS |
| QB | VSS | VSS | V2 | V3/VDD | VSS/VDD | VSS/VDD |
| BL | VSS | X | X | X | X | High |
| BLB | VSS | X | X | X | X | Low |
| SWL | VDD pulse | VSS | VSS | VSS | VSS | VDD |
| VDDP | VSS | VSS | VSS | Ramp to VDD | Stay VDD | VDD |
| VSSP | VSS | Ramp to VDD | VDD | VDD | Ramp to VSS | VSS |

TABLE 3-continued

| Recall | First step | Second step | Third step | Fourth step | Fifth step | Sixth step |
|---|---|---|---|---|---|---|
| FWL | VSS | Ramp to VPP2 | VPP2 stay flat | VPP2 stay flat | VPP2 stay flat | VSS |
|  | SRAM initial set Q = QB = VSS | Detect ΔVt12 by coupling | ΔVt12 appears on Q and QB | 1st amplification by ramping up VDDP | 2nd amplification by ramping down VSSP | Back to SRAM operation |

Note:
VDD < VPP2 < VPP and is preferred to be around a maximum Vt value of the paired Flash transistors.

Figure 5A:
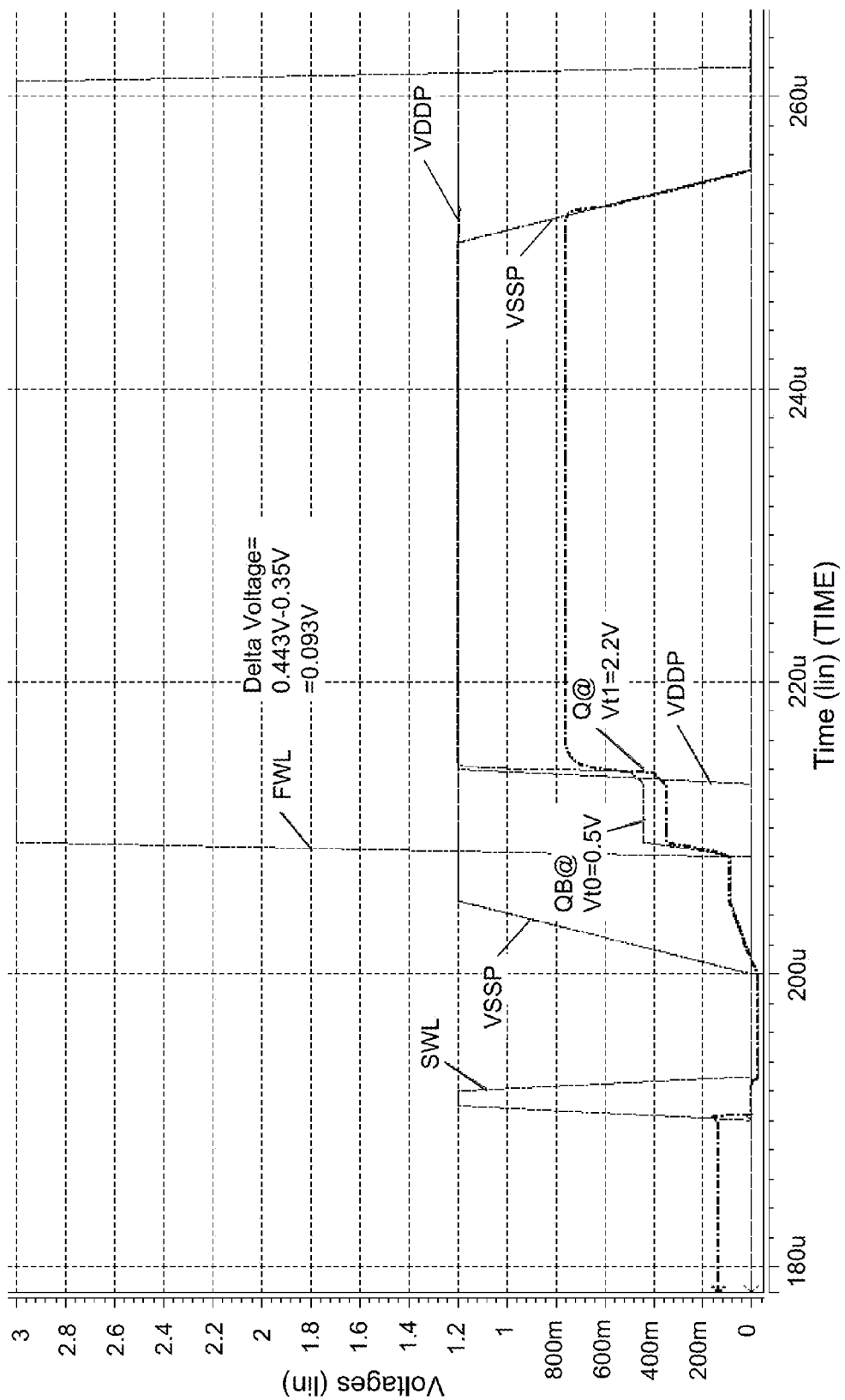
FIG. 5A is a chart showing the simulation result of an 8T NMOS NVSRAM cell's Recall operation using a DRAM-like charge-sensing scheme according to a specific embodiment of the present invention.

FIG. 5A is a chart showing simulation results of a successful 8T NMOS NVSRAM cell's Recall operation using a DRAM-like charge-sensing scheme according to a specific embodiment of the present invention. This simulation is associated with the following bias conditions: VDD=1.2V, Vt1 of the first Flash transistor is set to 2.2V and Vt0 of the second Flash transistor is set to 0.5V. The simulation results graphically illustrate how the Recall operation is performed in a time sequence of biasing control listed in Table 3 above.

The Recall operation is first initializing (a first step) the SRAM cell by applying a VDD pulse to SWL to set Q and QB to VSS, BL and BLB at VSS, VSSP and VDDP all are at VSS=0V.

At around 200 μs, VSSP is first ramped to VDD to start the second step. Charge levels at Q and QB may increase due to the SRAM operation. Sooner, at around 208 μs, the Flash gate FWL is ramped from VSS to VPP2=3V, which is at least higher than Vt0 level to at least turn on one of the paired transistors. In current case, 3V is greater than both Vt1 and Vt0 so that it will turn on both Flash transistors. But the Vt difference can induce different charges from the first and the second Flash transistors to the nodes Q and QB. As seen in FIG. 5A, about 0.1V charge difference in Q and QB is observed.

At about 213 μs, the VDDP is ramped up from VSS to VDD (a fourth step) to start SRAM amplification operation to amplify the about detected charge level difference of about 0.1V between Q and QB. As shown, after 214 μs, charge level at Q node is raised to VDD=1.2V along with certain increase of charge level at QB (to about 0.75V).

Subsequently, at 250 μs, the VSSP line is ramped down while keeping VDDP line at VDD to start (the six step) another SRAM amplification to pull down the charge level at QB while retaining the charge level at Q=VDD. For a short time, after 255 μs, QB becomes VSS=0V.

The simulation shows that for VDD as low as 1.2V operation, this 8T NVSRAM cell can use the charge-sensing scheme to detect nearly 0.1V charge difference across Q and QB by ramping flash gate line to 3V, which can be amplified by SRAM to full digital scale of VDD vs. VSS.

Figure 5B:
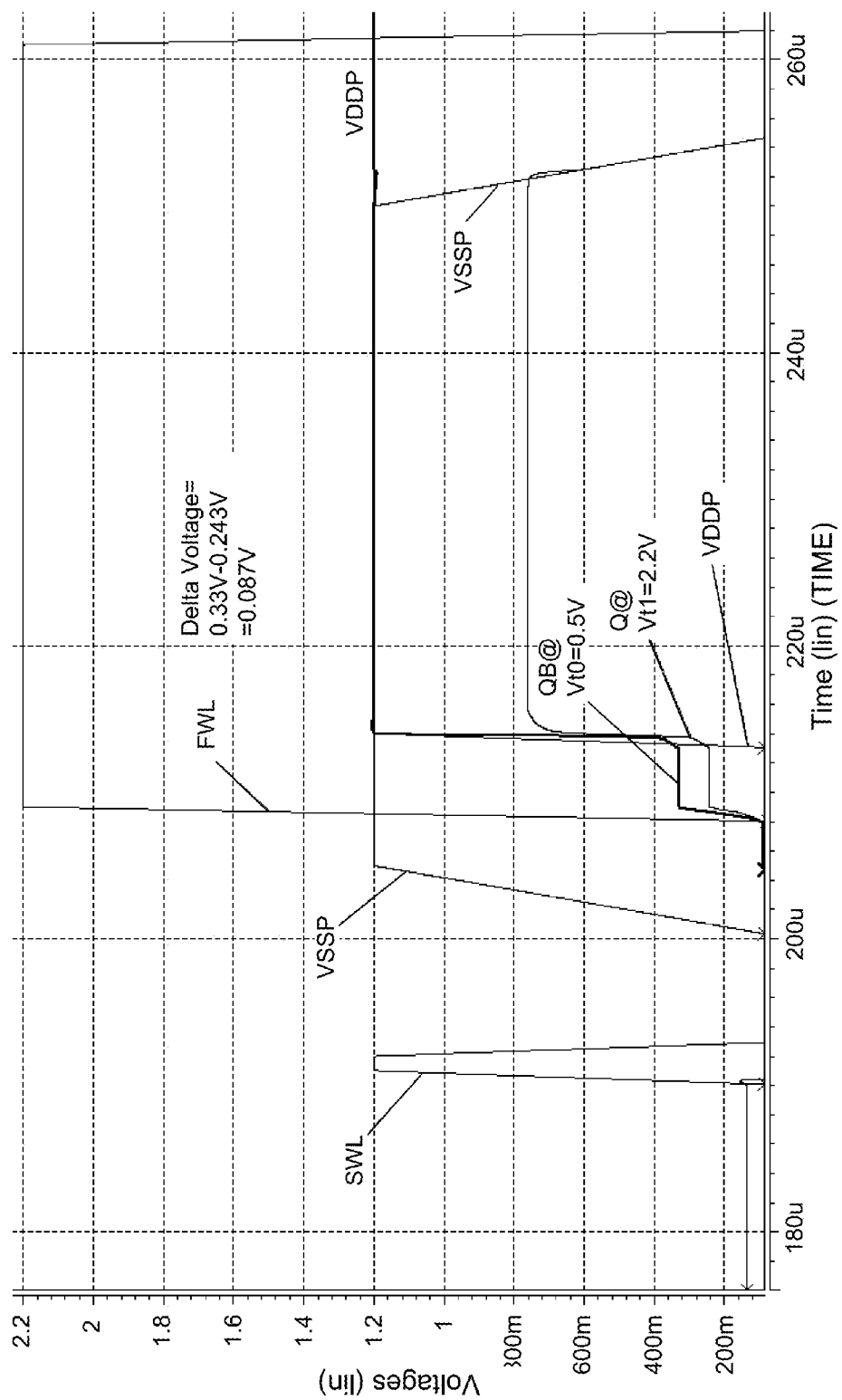
FIG. 5B is a chart showing the simulation result of an 8T NMOS NVSRAM cell's Recall operation using a DRAM-like charge-sensing scheme according another specific embodiment of the present invention.

FIG. 5B is a chart showing the simulation result of a successful 8T NMOS NVSRAM cell's Recall operation using a DRAM-like charge-sensing scheme according another specific embodiment of the present invention. In this simulation, all bias conditions are substantially the same as the FIG. 5A based on the simulation circuit shown in FIG. 4, except the Flash gate line FWL is only ramped to 2.2V which equals to Vt1 to allow only one Flash transistor to be turned on. The results are substantially similar to those in FIG. 5A.

The Recall operations of 8T 1-poly NMOS NVSRAM cell shown in FIG. 1B and 8T PMOS 2-poly NVSRAM cell shown in FIG. 1C would be similar to the operations for FIG. 1A as explained above.

In an alternative embodiment, the present invention provides an 8T NVSRAM cell including one LV 6T SRAM cell and one HV 2T Flash cell that further comprises one paired fully symmetrical 1T Flash transistor without any top Select transistor, while the two source nodes of the paired Flash transistor are tied to a common source line configured to supply currents for cell operation. Several options of preferred Program and Erase schemes can be used for the 8T NVSRAM cell including 1) FN-channel scheme which is a low-current with a positive high voltage VPP applied to a common gate of the paired Flash transistors to increase their threshold levels Vts within 1-5 ms through Flash transistor channel and with a negative high voltage VNN applied to the common gate of the paired Flash transistors to decrease their Vts within 1-5 ms. 2) FN-edge scheme which is another low-current scheme used to decrease the paired Flash transistor Vt within 1-5 ms through Flash drain and source edge.

The FN-edge scheme can create larger ΔVt between the paired flash transistors over the counterparts of FN-channel due to the strong electric field at edge than channel. The ΔVt is detected from the paired Flash cell different programmed Vts and then exemplified by each 6T SRAM cell during a Recall operation of the 8T NVSRAM cell. For reliable ΔVt detection, the paired Flash transistors are configured into paired Voltage Followers with their respective drain and gate voltages are coupled to the preferred voltages with the details to be explained thereafter of this specification.

The regular operation of a so-called paired Voltage-Follower needs to meet the following equation of $$Vgs - Vtn \leq Vds,$$

where Vgs is the gate voltage of Flash pairs. Vtn is the individual programmed Vt values stored in paired flash transistors. Vds is the voltage drop across the paired Flash transistors drain and source nodes.

The goal of ΔVt is to achieve ΔVt≥1V. The detailed steps for operating the 8T NVSRAM cell and array using a current charging scheme in Recall operation will be explained below in accordance with the spirit of the present invention.

Figure 6A:
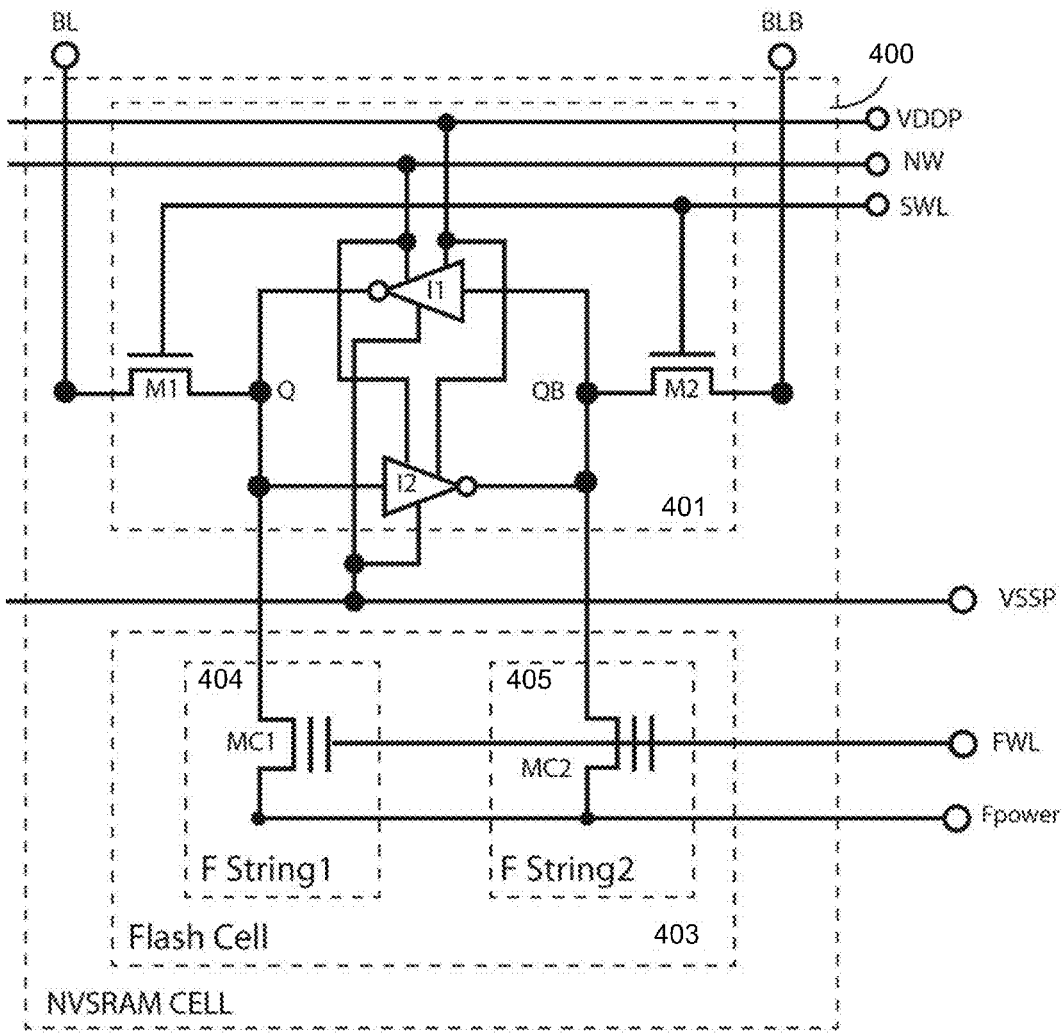
FIG. 6A is a circuit diagram of an 8T 2-poly NMOS floating-gate flash type NVSRAM cell according to an alternative embodiment of the present invention.

FIG. 6A shows a 2-poly NMOS 8T NVSRAM cell 400 including one 6T LV SRAM cell 401 and one 2T HV Flash cell 403. Each Flash cell 403 includes two Flash transistors only, MC1 in 1T Flash string1 404 and MC2 in Flash string2 405, respectively made by two HV NMOS 2-poly floating-gate transistors. In particular, the source nodes of MC1 and MC2 are tied to one common line of Fpower. The drain nodes of MC1 and MC2 are directly connected to the paired nodes of Q and QB of the 6T SRAM 401, respectively without any top Select transistors as the conventional 12T NVSRAM cell. The SRAM cell 401 has two Inverters I1 and I2 respectively with two output nodes Q and QB connected to bit lines BL and BLB through two LV NMOS device M1 and M2 controlled by word line SWL. The two Inverters I1 and I2 are powered from a common power line VDDP for powering PMOS devices and another power line VSSP for power NMOS devices to charge/amplify charges from bit lines to the two nodes Q and QB by drawing currents.

Figure 6B:
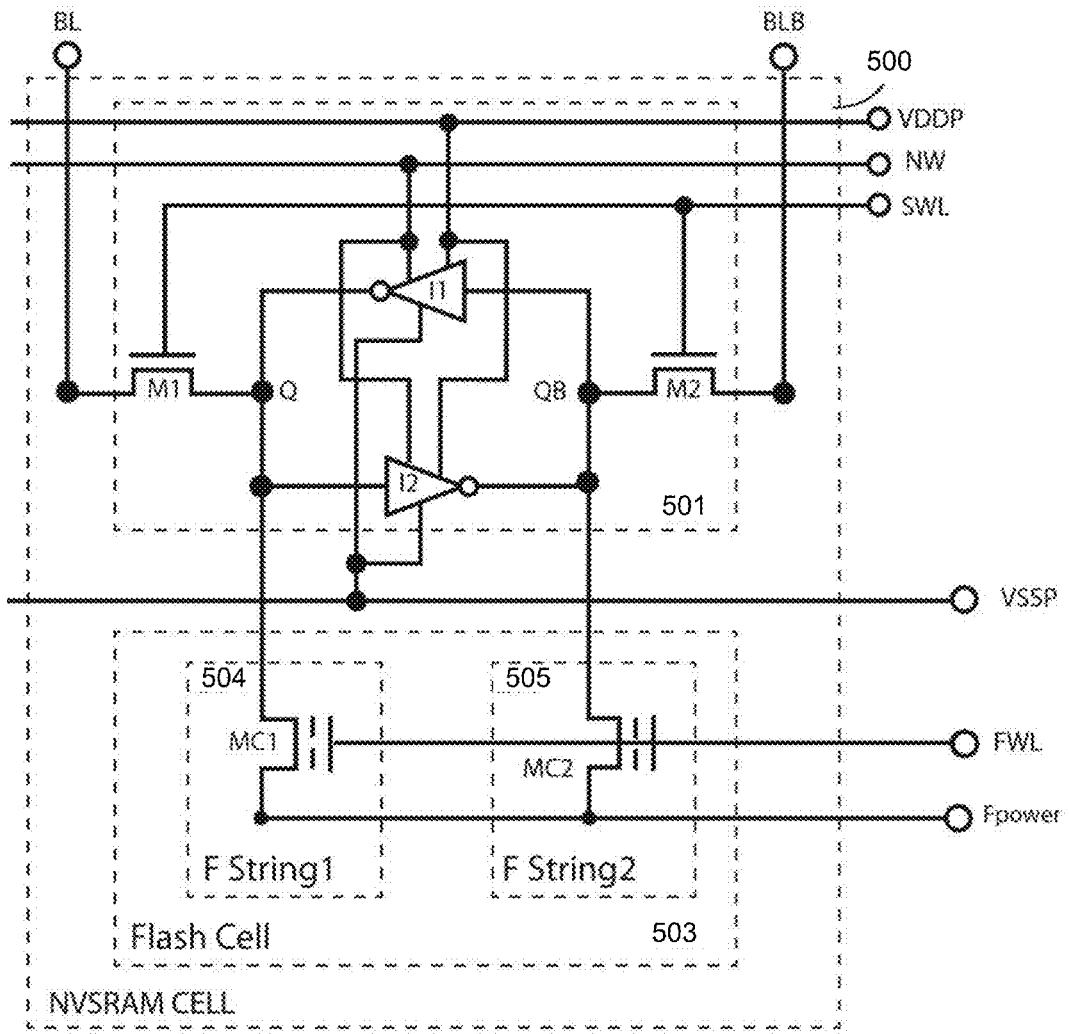
FIG. 6B is a circuit diagram of an 8T 1-poly SONOS or MONOS charge-trapping flash type NVSRAM cell according to another embodiment of the present invention.

In another alternative embodiment, FIG. 6B shows a 1-poly NMOS 8T NVSRAM cell 500 including one 6T LV SRAM cell 501 and one 2T HV Flash cell 503. Each SRAM cell 501 is substantially the same as SRAM cell 401 described above. Each Flash cell 503 includes two Flash transistors only, MC1 in 1T Flash string1 504 and MC2 in Flash string2 505, respectively made by two HV SONOS or MONOS 1-poly charge-trapping transistors. Both source nodes of MC1 and MC2 are tied to one common line of Fpower. The 8T NVSRAM cell 500 has substantially the same functionality as the 8T NVSRAM cell 400, except the HV VPP (or VNN) voltage in program or erase flash operation of the former cell version is only +10V (or −10V) compared to +15V (or −15V) or higher for latter cell version.

Figure 6C:
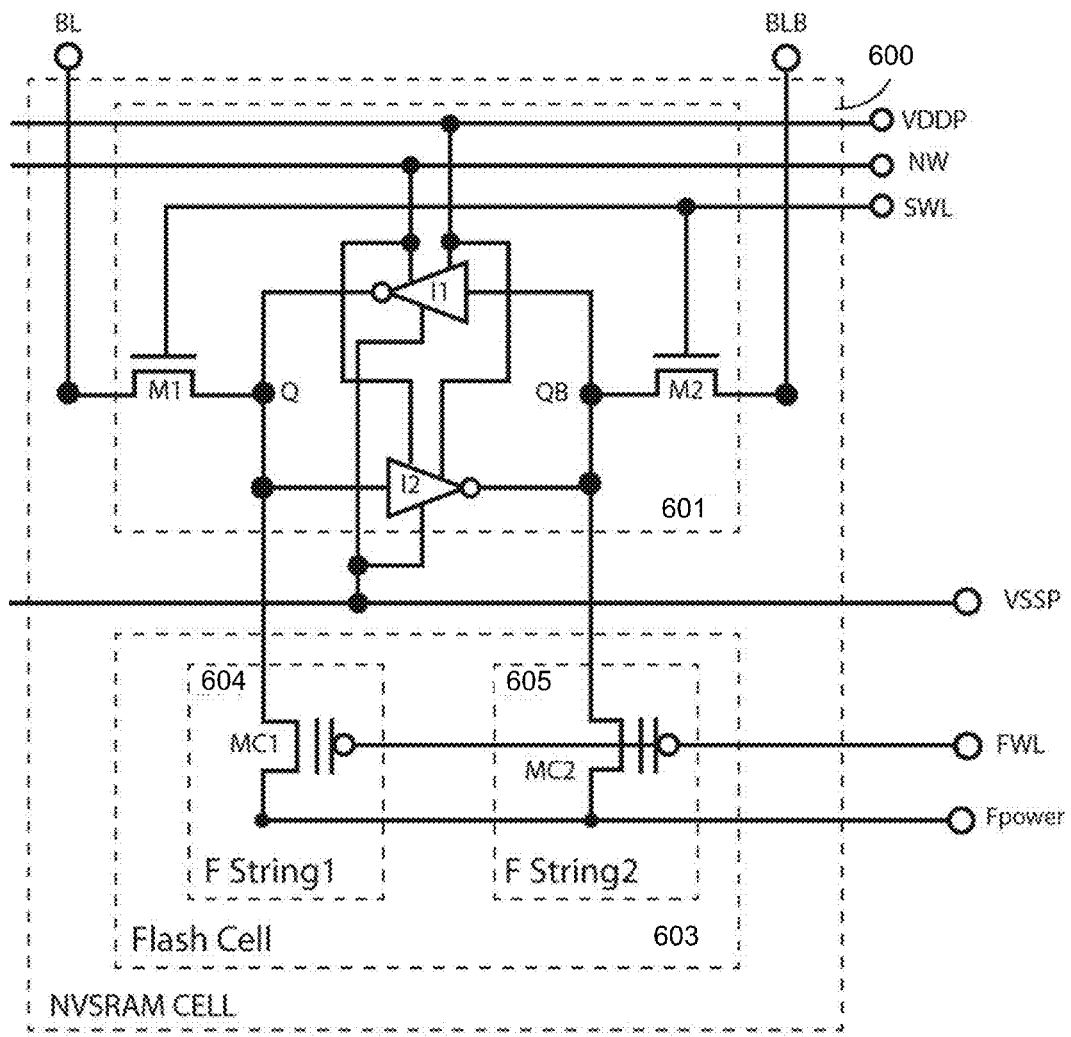
FIG. 6C is a circuit diagram of an 8T 2-poly PMOS floating-gate flash type NVSRAM cell according to yet another embodiment of the present invention.

Furthermore, FIG. 6C shows yet another alternative version of a 2-poly PMOS 8T NVSRAM cell 600 including one 6T LV SRAM cell 601 and one 2T HV Flash cell 603. Each SRAM cell 601 is substantially the same as SRAM cell 401 described above. Each Flash cell 603 includes two Flash transistors only, MC1 in 1T Flash string1 604 and MC2 in Flash string2 605, respectively made by two HV PMOS 2-poly floating-gate transistors. Both source nodes of MC1 and MC2 are tied to one common line of Fpower. Again, the functionality of this 8T NVSRAM cell 600 is substantially the same as the 8T NVSRAM cell 400.

Now several key operations of the 8T NVSRAM cell in a NVSRAM memory (including M×N array of 8T NVSRAM cells) are described below using the 2-poly NMOS 8T NVS-RAM cell of FIG. 6A as an example. For SRAM Read and Write operations, each SRAM cell is still electrically isolated from the corresponding Flash cell although no top Select transistor exists. The bias conditions can be set by applying VSS to FWL and Fpower line at don't care (either VDD or VSS), then setting SWL=VDD for the select SRAM cells in a single selected SRAM word line WL, but SWL=VSS for the all non-select SRAM cells in non-selected N−1 SRAM word lines WLs and setting VDDP=VDD and VSSP=VSS.

For Flash operation, including erasing and programming the flash cells by changing their corresponding Vt levels, only one option of Program and Erase is used for this 8T NVS-RAM cell (of FIG. 6A). For example, a FN-channel Erase is used by applying +18V VPP on FWL line with respective VSS=0V (at Fpower line) coupled on the Flash transistor MC1 and MC2's channel to increase to a same initial positive (erased) Vte after 1-5 ms. The Vte value is preferred to be above VDD plus a small margin. The VSS in both MC1 and MC2 channel can be achieved by setting the following biased conditions of BL=BLB=VSS with SWL=VDD (a pulse is applied) and VDDP=VSSP=VSS initially. Q and QB nodes can be at different charge levels but during the erase operation, they are left floating. Other bias conditions for SRAM word line SWL and two bit lines BL and BLB can be at Don't care states.

The next Program operation can use another similar low-current FN-edge scheme as explained above by applying a negative VNN voltage to the FWL line with Q and QB nodes coupled to either VDD or VSS in a normal SRAM logic states and Flash source nodes tied to the Fpower line in floating. The paired Flash transistor Vt would be decreased to two different values due to two different drain edge voltages of VSS and VDD. The VNN voltage is set between −15V to −18V. After a predetermined program time of 1-5 ms, the $\Delta Vtp \geq 1.5V$ can be achieved even under VDD=1V and VSS=0V condition.

Additionally, the Vt difference after programming the MC1 and MC2 $\Delta Vtp \geq 1.5V$ can generate a $\Delta V_{Q\text{-}QB}=0.4V$ with same MC1 Vtp=2.2V but MC2 Vtp=1.2V.

The Store operation is defined as above combined first Erase and second Program operation to write each SRAM cell's logic state in terms of voltages at Q and QB nodes into MC1 and MC2 paired flash transistors. Typically, the final SRAM's logic states would set up every Q and QB to the desired VDD and VSS voltage before Store operation is initiated. Then once the Store operation starts, the Q and QB voltages are forwarded to the respective drain voltages of MC1 and MC2 flash transistors. There is no isolation between the SRAM cell and the Flash cell in this 8T NVSRAM cell so that the full VSS and VDD of Q and QB pass to the drain nodes of MC1 and MC2. As a result, the final $\Delta Vtp \geq 1.5V$ is achieved when the FN-edge program scheme is used.

The Recall operation of this 8T NVSRAM cell of FIG. 6A under a SRAM-like current charging scheme to charge up Q and QB nodes with a different voltages of $\Delta V_{Q\text{-}QB}$ at Q and QB nodes though the MC1 and MC2 paired Flash Voltage Followers is described below based on a simulation circuit of FIG. 7A and associated simulation waveforms shown in FIG. 7B. Furthermore, the Recall operation referred there also is applicable to either one of the 8T NVSRAM cells shown in FIGS. 6A-6C.

Figure 7A:
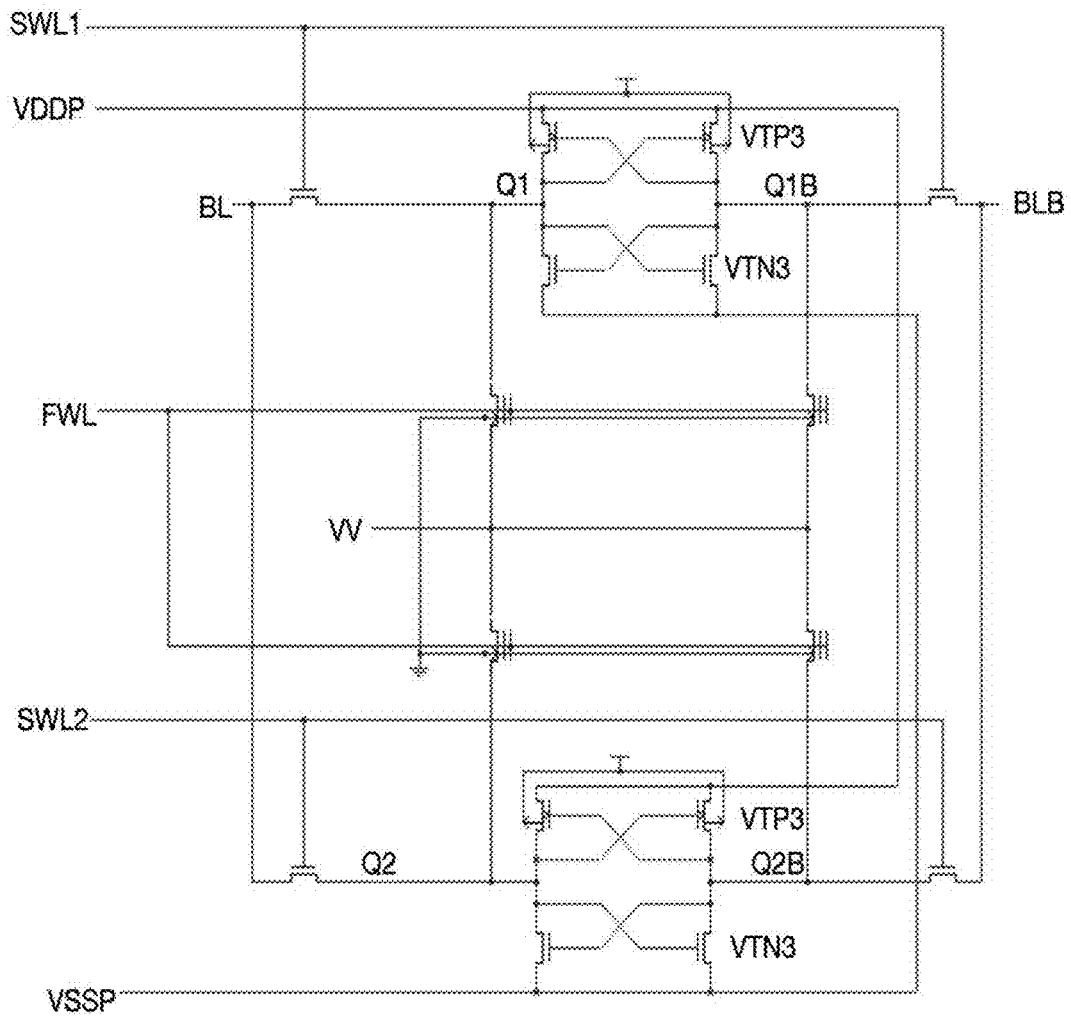
FIG. 7A is a circuit diagram of an 8T NMOS 2-poly NVSRAM's simulation circuit for NVSRAM's Recall operation with the paired Flash transistors' source nodes connected to a common power line of VDD along with a 2-step SRAM's amplification of the present invention.

FIG. 7A shows a simulation circuit of a paired 8T NVS-RAM cell made by two 8T NVSRAM cells of FIG. 6A symmetrically laid on top and bottom sharing a common source line coupled to VV connected to VDD power supply along with a 2-step SRAM's amplification in accordance of the present invention.

Figure 7B:
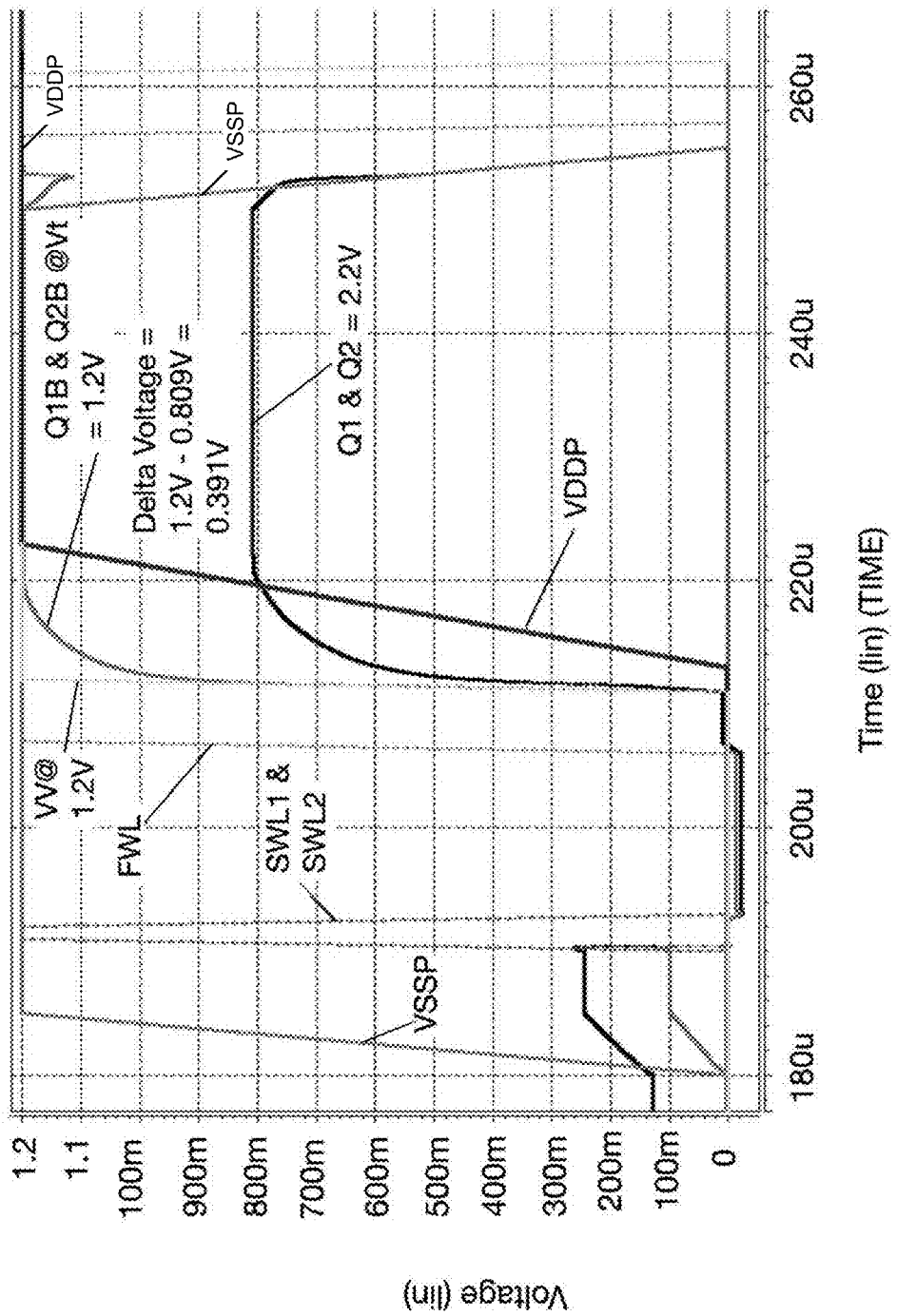
FIG. 7B is a plot of a set of simulation waveforms of the NMOS 2-poly NVSRAM cell of FIG. 7A in accordance with the present invention.

FIG. 7B is shows a set of simulation waveforms for a paired 8T NMOS 2-poly NVSRAM cell of FIG. 7A in accordance with the present invention. As shown, the waveforms are generated assuming two flash transistors MC1 Vt=2.2V but MC2 Vt=0.5V. The simulation proves the current charging scheme from Flash power lines to the paired Q and QB nodes of each SRAM cell works at 1.2V VDD operation when one paired Flash transistors are configured into a Voltage Follower with a $\Delta Vt \geq 1V$. Other smaller $\Delta Vt=0.5V$ also works.

Since there are two Flash pairs of the one paired 8T NVS-RAM cell, there are four logic states of Flash transistors as explained below. However, since the Fpower line is a string VDD source, the Recall operations of top and bottom 8T NVSRAM cells are not affected by each other and operate independently.

Assuming the VDD=1.2V in this simulation, the $\Delta Vtp \geq 1.8V$ can be achieved as explained above with reference to FIG. 4 when FN-edge program scheme is adopted. The larger $\Delta Vtp$, the superior $\Delta V_{Q\text{-}QB}$ at Q and QB nodes for each SRAM amplification subsequently. In this simulation, we assumed the worst-case $\Delta Vtp=1.0V$ for MC1=2.2V but MC2=1.2V. The top and bottom NVSRAM cells have the identical MC1 and MC2 with Vt values, MC1 Vt=1.2≤FWL=VDD=1.2V<MC2 Vt=2.2V.

In a specific embodiment, as like the conventional 12T NVSRAM cell, this 8T NVSRAM cell uses the similar SRAM-like current charging scheme in the Recall operation to charge up Q and QB nodes with a voltage difference of $\Delta V_{Q\text{-}QB}$ at either the top SRAM cell or the bottom SRAM cell though the corresponding paired Flash cell and associated Flash Voltage Followers. Due to the $\Delta Vtp>1.0V$ in worst-case stored in one paired flash transistors, for example, MC1 and MC2, with the initial set values of Q1=Q1B=VSS and MC1 Vt (2.2V)>MC2 Vt (1.2V). With FWL=VDD=1.2V, the MC1 and M2 Voltage Followers generate a voltage difference $\Delta V_{Q\text{-}QB} \approx 0.42V$ at Q1 and Q1B nodes of the top SRAM cell. In particular, the Recall operation, referring to simulation circuit for the paired 8T NVSRAM cell of FIG. 7A, is preferably divided into six steps as shown in the following Table 4:

TABLE 4

| Recall | 1st step | 2nd step | 3rd step | 4th step | 5th step | 6th step |
|---|---|---|---|---|---|---|
| Q1 | VSS | VSS | V1 | V3/VDD | VSS/VDD | VSS/VDD |
| Q1B | VSS | VSS | V2 | VDD/V3 | VDD/VSS | VDD/VSS |
| Q2 | VSS | VSS | V1 | V3/VDD | VSS/VDD | VSS/VDD |
| Q2B | VSS | VSS | V2 | VDD/V3 | VDD/VSS | VDD/VSS |
| BL | VSS | X | X | X | X | Low/High |
| BLB | VSS | X | X | X | X | High/Low |
| SWL1/ SWL2 | VDD pulse | VSS | VSS | VSS | VSS | VDD |
| VDDP | VSS | VSS | VSS | Ramp to VDD | Stay VDD | VDD |
| VV | VSS | VSS | Ramp to VDD | Stay VDD | Stay VDD | VSS |
| VSSP | VSS | Ramp to VDD | VDD | VDD | Ramp to VSS | VSS |
| FWL1 & FWL2 | VSS | Ramps to VDD | Stays VDD | Stays VDD | Stays VDD | VSS |
| Function | SRAM initial set Q = QB = VSS by pulsing SWL & connect SRAM & Flash Set VSSP = VDD VDDP = VSS | Setup the paired Flash Voltage Follower by setting FWL = VDD > Vtmin, under Vgs-Vt ≤ Vds | Detecting ΔVt stored In MC1 & MC2 or MC3 and MC4 by ramping Fpower = VDD | 1st SRAM Amplification by ramping VDDP = VDD | 2nd SRAM Amplification by ramping VSSP = VSS | Back to SRAM operation | where V1, V2, and V3, are some voltage levels associated with either Q and QB nodes during the SRAM amplification stage. During the Recall operation the common Nwell of the SRAM cell is held at VDD all the time. Depending on last programmed Vt levels in the paired Flash transistor MC1 and MC2, when the VDDP line is ramped from VSS to VDD, the Flash transistor with smaller Vt is associated with more current flowing through the corresponding Flash string. Accordingly, the one SRAM data node Q or QB coupled to the corresponding Flash string will be amplified to VDD level first. Conversely, when the VSSP line is ramped from VDD to VSS, the other data node coupled to the Flash string that is associated with the Flash transistor with higher Vt will be pulled to the VSS=0V (or being amplified in other direction).

Note, Table 4 above is designated for a cell structure that includes two mirrored top and bottom 8T NVSRAM cells sharing one common Fpower line coupled to corresponding top and bottom flash source lines. Both top and bottom 8T NVSRAM cells are subjected to the Recall operation independently so that Table 4 is also applicable to just a one-side cell structure with either top or bottom 8T NVSRAM cell only.

In FIG. 7B the simulation waveforms show at timeline 180 µs, each SRAM VSS line, VSSP, is connected to VDD with VDDP line kept at VSS. This is the first step of Recall operation as explained in above TABLE 4.

At time line 190 µs it enter an earlier stage of the second step, both Q=QB=VSS with $\Delta V_{Q\text{-}QB}$=0V when SWL1=SWL2=VDD for a short duration to preset Q=QB=BL=BLB=VSS and later SWL1=SWL2=VSS to isolate Q and QB from BL and BLB in both top and bottom 8T NVSRAM cells. Now, the Q and QB nodes of each SRAM cell are ready to be charged up from initial same VSS voltage to a final voltage determined by corresponding Vts and the sub-threshold leakage current of MC1/MC3 and MC2/MC4 and a Fpower voltage which is ramped from VSS up to VV=1.2V in this simulation.

At timeline 206 µs, the FWL is ramped to VDD=1.2V to enter into a later stage of the second step of the Recall operation shown in Table 4 above. In this stage, the paired Flash transistors of paired transistors of MC1 and MC2 or MC3 and M4 are configured into a paired Voltage Follower that meets the condition of Vgs−Vt<Fpower when the Fpower is ramped to 1.2V VDD later. After that the ΔVtp is detected and pass to Q and QB with less than 50% $\Delta V_{Q\text{-}QB}$ at Q and QB nodes.

At timeline ≈212 µs, the Fpower is ramped to VDD=1.2V to enter into the third step in the Table 4 above. The ΔVtp is detected and passed to Q and QB nodes in respective SRAM cells. A final $\Delta V_{Q\text{-}QB}$=0.42V is generated at Q and QB nodes of respective SRAM cells after time line 220 µs to 250 µs.

At timeline 213 µs, it enters into the fourth step of a Recall operation. The VDDP line of SRAM is ramped first from VSS to VDD=1.2V. This is the first amplification of the SRAM for this invention. Since the DC levels of both Q and QB are higher than VDD-Vtp where Vtp is the PMOS threshold of two Inverters of SRAM's Latch circuits. Thus from the simulation, in this first amplification stage, no gain in $\Delta V_{Q\text{-}QB}$=0.42V. In other case, if the DC level of Q and QB are below VDD-Vtp, then some gain can be achieved by ramping SRAM's VDDP from VSS to VDD=1.2V.

At timeline 250 µs, it enters into the fifth step of a Recall operation. Conversely, the VSSP line of SRAM is ramped down from VDD=1.2V to VSS. This is the second amplification of the SRAM for this invention. The Q1=Q2 voltage of 0.78V is pulled to VSS=0V with Q1B=Q2B=VDD=1.2V. Thus, $\Delta V_{Q\text{-}QB}$=0.42V is increased to $\Delta V_{Q\text{-}QB}$=1.2V. As a conclusion, after the second SRAM amplification, Q and QB voltage difference $\Delta V_{Q\text{-}QB}$ becomes a full VDD. That concludes a fully successful Recall operation of this preferred 8T NVSRAM cell design.

After 255 µs time line, all the setup is reset to return SRAM's operation by setting Fpower=VSS, FWL=0V, SWL=VDD along with VDDP=VDD and VSSP=VSS. This is the sixth step of this NVSRAM Recall operation. Note, during the six steps of the Recall operation of 8T NVSRAM cell, the NW node of two Inverters, I1 and I2 of each 6T SRAM's cell is always kept at VDD without change. Only the power line, VDDP, of two Inverters of each SRAM cell are set to VSS first and then ramped to VDD later for the 2-step SRAM amplification.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An 8T NVSRAM memory cell circuit with DRAM-like charge-sensing scheme, the 8T NVSRAM memory cell comprising:
a SRAM cell comprising two inverters cross-coupled to a first pass transistor and a second pass transistor commonly gated by a first word line and respectively coupled drains to a first bit line and a second bit line and sources to a first data node and a second data node, the first data node and the second data node respectively being outputted from the two invertors, each inverter including a PMOS device connected to a first power line and a NMOS device connected to a second power line, the first power line and the second power line being operated between a VDD power supply and ground and being separated from a common Nwell node; and
a Flash cell comprising a first cell string and a second cell string sharing a common P-sub, the first cell string including a first Flash transistor having a first drain node and first source node, the second cell string including a second Flash transistor having a second drain node and a second source node, the first and the second Flash transistors being gated commonly by a second word line, the first drain node being connected to the first data node, the second drain node being connected to the second data node, the first source node and the second source node being floating;
wherein the second word line is configured to ramp up to a voltage level sufficient to detect as small as 1V threshold level difference between the first Flash transistor and the second Flash transistor and pass a voltage level difference to the first data node and the second data node, the two cross-coupled inverters are operated to amplify the voltage level difference to a scale of VSS=0V at one of the first data node and the second data node and the VDD level at another one of the first data node and the second data node.

2. The 8T NVSRAM memory cell of claim 1 wherein each of the first Flash transistor and the second Flash transistor is selected from a 2-poly NMOS floating-gate type transistor, a 1-poly SONOS or MONOS charge-trapping type transistor, and a 2-poly PMOS floating-gate type transistor.

3. The 8T NVSRAM memory cell of claim 1 wherein the SRAM cell is subjected to a Read and Write operation by setting the first word line to the VDD level if the SRAM cell is selected or to VSS=0V if the SRAM cell is not selected and applying the VDD level to the first power line and VSS to the second power line, while setting the second word line to VSS if the threshold levels of the first Flash transistor and the second Flash transistor are all positive or setting the second word line to a lowest negative threshold level if the threshold levels of the first Flash transistor and the second Flash transistor are all negative to isolated each SRAM cell from each corresponding Flash cell.

4. The 8T NVSRAM memory cell of claim 1 wherein the Flash cell is subjected to a FN-channel write operation from a loaded SRAM logic state "1" with the VDD level at the first data node and VSS at the second data node by setting the first word line to VSS and coupling a positive voltage VPP to the second word line using a FN-channel scheme to increase threshold levels of the first Flash transistor and the second Flash transistor to result in a Vt1 level of the first Flash transistor lower than a Vt2 level of the second Flash transistor after 1 ms write time to store a flash logic state of "0".

5. The 8T NVSRAM memory cell of claim 4 wherein the FN-channel write operation comprises increasing the Vt1 level of the first Flash transistor with the first drain node coupled to the VDD level less than increasing the Vt2 level of the second Flash transistor with the second drain node coupled to VSS to give a difference Vt2−Vt1 of about +1 V to +2 V within 1 ms to 10 ms.

6. The 8T NVSRAM memory cell of claim 4 wherein the difference Vt2−Vt1 varies only with the VDD level but substantially independent on write time.

7. The 8T NVSRAM memory cell of claim 4 wherein the VDD level is about 1 V to 2 V and the positive voltage VPP is about +15 V to +18 V for a 2-poly floating-gate type flash transistor or about +10 V for a 1-poly charge-trapping type flash transistor.

8. The 8T NVSRAM memory cell of claim 1 wherein the Flash cell is subjected to a FN-edge write operation from a loaded SRAM logic state "0" with VSS=0V at the first data node and the VDD level at the second data node and by setting the first word line to VSS and coupling a negative voltage VNN to the second word line using a FN-edge scheme to decrease threshold levels of the first Flash transistor and the second Flash transistor to result in a Vt1 level of the first Flash transistor lower than a Vt2 level of the second Flash transistor after 1 ms write time to store a flash logic state of "0".

9. The 8T NVSRAM memory cell of claim 8 wherein the FN-edge write operation comprises decreasing the Vt1 level of the first Flash transistor with the first drain node coupled to VSS more than decreasing the Vt2 level of the second Flash transistor with the second drain node coupled to the VDD level to provide a difference Vt2−Vt1 that can reach to +1.5 V within 1 ms to 10 ms of write time.

10. The 8T NVSRAM memory cell of claim 9 wherein the difference Vt2−Vt1 varies with the VDD level, the VNN, and write time, wherein the VDD level is limited below 2 V and the negative voltage VNN is about −15 V to −18 V for a 2-poly floating-gate type flash transistor or about −10 V for a 1-poly charge-trapping type flash transistor.

11. The 8T NVSRAM memory cell of claim 1 wherein the Flash cell is subjected to a Store operation comprising using either a FN-channel write operation or a FN-edge write operation without any pre-erase operation to write a loaded logic state from the SRAM cell to the Flash cell.

12. The 8T NVSRAM memory cell of claim 11 wherein the Store operation comprises using the FN-channel write operation to increase threshold levels of the first Flash transistor and the second Flash transistor in one time followed by using the FN-edge write operation to decrease threshold levels of the first Flash transistor and the second Flash transistor in next time for reversing threshold level movement direction.

13. The 8T NVSRAM memory cell of claim 1 wherein the SRAM cell is subjected to a Recall operation for writing a flash logic state stored in the Flash cell back to the first data node and the second data node under a charge-sensing scheme, the flash logic state including at least a state "1" defined by a Vt1 threshold level for the first Flash transistor and a Vt0<Vt1 threshold level for the second Flash transistor or a state "0" defined by a Vt0 threshold level for the first Flash transistor and a Vt1>Vt0 threshold level for the second Flash transistor.

14. The 8T NVSRAM memory cell of claim 13 wherein the Recall operation for writing a flash logic state "1" to the SRAM cell comprises a bias condition of pulsing the first word line to the VDD level for setting the first data node, the second data node, the first power line, and the second power line to VSS, ramping the second power line first from VSS to the VDD level and ramping the second word line from VSS to the voltage level, and sequentially ramping the first power line from VSS to the VDD level while maintaining the second power line at the VDD level followed by ramping the second power line from the VDD level to VSS while maintaining the first power line at the VDD level.

15. The 8T NVSRAM memory cell of claim 14 wherein ramping the second word line from VSS to the voltage level comprises raising the voltage level above the VDD level but substantially below a programming voltage VPP of +18 V.

16. The 8T NVSRAM memory cell of claim 15 wherein ramping the second word line from VSS to the voltage level further comprises at least inducing a first capacitance charge at the first Flash transistor and a second capacitance charge at the second Flash transistor, the second capacitance charge being more than the first capacitance charge due to Vt0<Vt1, and causing the first capacitance charge to pass to the first data node and the second capacitance charge to pass to the second data node.

17. The 8T NVSRAM memory cell of claim 16 wherein the first capacitance charge is retained in the first data node and the second capacitance charge is retained in the second data node by setting the first power line to VSS and ramping the second power line from VSS to the VDD level.

18. The 8T NVSRAM memory cell of claim 13 wherein ramping the first power line from VSS to the VDD level while maintaining the second power line at the VDD level comprises pulling up the second capacitance charge at the second data node to substantially the VDD level in a first SRAM amplification operation.

19. The 8T NVSRAM memory cell of claim 13 wherein ramping the second power line from the VDD level to VSS while maintaining the first power line at the VDD level comprises pulling down the first capacitance charge at the first data node to VSS=0V in a second SRAM amplification operation.

20. The 8T NVSRAM memory cell of claim 13 wherein the Recall operation further comprises setting the first word line to the VDD level and resetting the first power line to the VDD level, the second power line to VSS=0V, and the second word line to VSS=0V to return to a SRAM operation with a loaded logic state associated with the VDD level at the first data node and VSS at the second data node.

21. An 8T NVSRAM memory cell circuit with a current-charging scheme, the 8T NVSRAM memory cell comprising:
a SRAM cell comprising two inverters cross-coupled to a first pass transistor and a second pass transistor commonly gated by a first word line and respectively coupled drains to a first bit line and a second bit line and sources to a first data node and a second data node, the first data node and the second data node respectively being outputted from the two invertors, each inverter including a PMOS device connected to a first power line and a NMOS device connected to a second power line, the first power line and the second power being operated between a VDD power supply and a ground level VSS=0V; and a Flash cell comprising a first Flash transistor and a second Flash transistor sharing a common P-sub, the first Flash transistor having a first drain node and a first source node, the second Flash transistor having a second drain node and a second source node, the first drain node being coupled to the first data node, the second drain node being coupled to the second data node, the first and the second Flash transistors being gated commonly by a second word line, the first source node and the second source node being commonly coupled to a third power line;

wherein the third power line is configured to ramp up to the VDD level to cause two different currents flown through the first Flash transistor and the second Flash transistor associated with a threshold level difference greater than 1 V to generate two different charge levels at the first data node and the second data node in a Recall operation, the two cross-coupled inverters are configured to amplify the two different charge levels to one at the VDD level and another one at VSS=0V by sequentially ramping the first power line from a preset VSS=0V to the VDD level followed by ramping the second power line from a preset the VDD level to VSS=0V.

22. The 8T NVSRAM memory cell of claim 21 wherein each of the first Flash transistor and the second Flash transistor is selected from a 2-poly NMOS floating-gate type transistor, a 1-poly SONOS or MONOS charge-trapping type transistor, and a 2-poly PMOS floating-gate type transistor.

23. The 8T NVSRAM memory cell of claim 21 wherein the SRAM cell is subjected to a Read and Write operation by setting the first word line to the VDD level if the SRAM cell is selected or to VSS=0V if the SRAM cell is not selected and applying the VDD level to the first power line and VSS to the second power line, while setting the select-gate control line to VSS to isolated the SRAM cell from corresponding Flash cell with the second word line and the third power line set to either the VDD level or VSS.

24. The 8T NVSRAM memory cell of claim 21 wherein the Flash cell is subjected to an Erase operation including an isolation step by at least setting the first power line to VDD and the second power line to VSS, setting the second word line to VSS, setting the third power line to VSS, and leaving the first data node and the second data node at either VSS or the VDD level which are isolated from the first Flash transistor and the second Flash transistor.

25. The 8T NVSRAM memory cell of claim 24 wherein the Flash cell is subjected to an Erase operation including an erase step following the isolation step by further ramping the second word line from VSS up to a positive high voltage VPP to use a FN-channel scheme to increase threshold levels of both the first Flash transistor and the second Flash transistor to a same erased level Vte≥the VDD level with 1 V margin.

26. The 8T NVSRAM memory cell of claim 25 wherein the high voltage VPP is ranged from +15 V to +18 V for a 2-poly NMOS or PMOS floating-gate type Flash cell, or +10 V for a 1-poly SONOS or MONOS charge-trapping type Flash cell.

27. The 8T NVSRAM memory cell of claim 21 wherein the Flash cell is subjected to a Program operation after an Erased operation that sets an initial threshold level Vte ≥the VDD level with 1 V margin same for both the first Flash transistor and the second Flash transistor, the Program operation including a preset step by at least setting the first power line to the VDD level and the second power line to VSS, the first word line to VSS, the second word line to the VDD level, the third power line to float, and optionally loading either the first data node to the VDD level and the second data node to VSS or the first data node to VSS and the second data node to the VDD level.

28. The 8T NVSRAM memory cell of claim 27 wherein the Flash cell is subjected to a Program operation including a program step following the preset step by ramping the second word line from the VSS to a negative high voltage VNN to use a FN-edge scheme to decrease threshold level of the first Flash transistor from the initial threshold level Vte to a first final level and decrease threshold level of the second Flash transistor from the Vte to a second final level, the second final level being at least 1.5 V greater than the first final level for the VDD level as low as about 1 V.

29. The 8T NVSRAM memory cell of claim 28 wherein the high voltage VNN is ranged from −15 V to −18 V for a 2-poly NMOS or PMOS floating-gate type Flash cell, or −10 V for a 1-poly SONOS or MONOS charge-trapping type Flash cell.

30. The 8T NVSRAM memory cell of claim 21 wherein the SRAM cell is subjected to a Recall operation for writing a flash logic state "1" defined by a Vt1 threshold level assigned to the first Flash transistor and a Vt2 threshold level assigned to the second Flash transistor to the SRAM cell, the Vt1 being at least greater than Vt2 by 1 V.

31. The 8T NVSRAM memory cell of claim 30 wherein the Recall operation comprises a bias condition of initializing the first data node and the second data node to VSS by pulsing the first word line to the VDD level and setting the first power line and the second power line to VSS, setting the second word line to VSS, and setting the third power line to VSS.

32. The 8T NVSRAM memory cell of claim 31 wherein the Recall operation further comprises ramping the second power line to the VDD level while maintaining the first power line at VSS=0V followed by ramping the second word line from VSS=0V to the VDD level under a condition that the VDD level is at least greater than the Vt2 but not greater than the Vt2 plus a voltage drop across drain and source of the second Flash transistor.

33. The 8T NVSRAM memory cell of claim 32 wherein the Recall operation further comprises maintaining the second word line at the VDD level while ramping the third power line from VSS=0V to the VDD level to cause a first voltage at the first data node and a second voltage at the second data node through a voltage-follower operation respectively through the first Flash transistor and the second Flash transistor, the second voltage being greater than the first voltage by a first amount less than the VDD level.

34. The 8T NVSRAM memory cell of claim 33 wherein the Recall operation further comprises maintaining the second word line at the VDD level and the third power line at the VDD level, ramping the first power line from VSS=0V to the VDD level while maintaining the second power line at the VDD level to change the second voltage to the VDD level at the second data node.

35. The 8T NVSRAM memory cell of claim 34 wherein the Recall operation further comprises maintaining the second word line at the VDD level, the third power line at the VDD level, and subsequently ramping the second power line from the VDD level to VSS=0V while maintaining the first power line at the VDD level to change the first voltage to VSS=0V at the first data node while to retain the second voltage at the VDD level at the second data node to restore a SRAM logic state of "0".

36. The 8T NVSRAM memory cell of claim 35 wherein the Recall operation further comprises resetting the select-gate control line to VSS=0V, the first word line to the VDD level, the second word line to VSS=0V, the first power line to the VDD level, the second power line to VSS=0V, and the third power line to VSS=0V.

* * * * *